(12) United States Patent
Wang

(10) Patent No.: US 7,939,347 B2
(45) Date of Patent: May 10, 2011

(54) SEMICONDUCTOR DEVICE MANUFACTURING METHOD

(75) Inventor: Wensheng Wang, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/548,838

(22) Filed: Aug. 27, 2009

(65) Prior Publication Data

US 2010/0055805 A1 Mar. 4, 2010

(30) Foreign Application Priority Data

Aug. 28, 2008 (JP) ................................ 2008-219353

(51) Int. Cl.
H01L 21/00 (2006.01)
H01L 21/84 (2006.01)
H01L 21/20 (2006.01)

(52) U.S. Cl. ..... 438/3; 438/154; 438/396; 257/E21.008; 257/E21.272

(58) Field of Classification Search ............... 438/3, 154, 438/396; 257/E21.208, E21.272
See application file for complete search history.

(56) References Cited

U.S. PATENT DOCUMENTS

| | | | |
|---|---|---|---|
| 5,508,953 A | 4/1996 | Fukuda et al. | |
| 6,146,906 A | 11/2000 | Inoue et al. | |
| 6,169,305 B1 | 1/2001 | Takai et al. | |
| 6,350,643 B1 * | 2/2002 | Hintermaier et al. | 438/240 |
| 6,376,090 B1 | 4/2002 | Kijima | |
| 6,388,285 B1 | 5/2002 | Black et al. | |
| 6,454,914 B1 | 9/2002 | Nakamura | |
| 6,509,601 B1 | 1/2003 | Lee et al. | |
| 6,713,808 B2 | 3/2004 | Wang et al. | |
| 6,781,179 B2 | 8/2004 | Nasu et al. | |
| 6,803,617 B2 | 10/2004 | Baniecki et al. | |
| 6,872,989 B2 | 3/2005 | Inoue et al. | |
| 7,029,925 B2 | 4/2006 | Celii et al. | |
| 7,083,269 B2 | 8/2006 | Murai | |
| 7,339,218 B2 | 3/2008 | Hidaka et al. | |
| 2005/0233476 A1 * | 10/2005 | Tatsunari | 438/3 |

FOREIGN PATENT DOCUMENTS

| | | |
|---|---|---|
| JP | 6-326270 A | 11/1994 |
| JP | 09-022892 A | 1/1997 |
| JP | 11-145418 A | 5/1999 |
| JP | 11-243179 A | 9/1999 |
| JP | 2000-091270 A | 3/2000 |
| JP | 2000-91539 A | 3/2000 |
| JP | 2000-091551 A | 3/2000 |
| JP | 2000-164818 A | 6/2000 |
| JP | 2000-357777 A | 12/2000 |
| JP | 2001-111007 A | 4/2001 |
| JP | 2002-151662 A | 5/2002 |
| JP | 2003-051583 A | 2/2003 |
| JP | 2003-068991 A | 3/2003 |

(Continued)

*Primary Examiner* — Alexander G Ghyka
*Assistant Examiner* — Seahvosh J Nikmanesh
(74) *Attorney, Agent, or Firm* — Westerman, Hattori, Daniels & Adrian, LLP

(57) ABSTRACT

A semiconductor device manufacturing method includes forming a first film made of a first metal to an upper portion of a substrate, forming a second film made of an amorphous metal oxide or an microcrystalline metal oxide on the first film, subjecting the second film to a heat treatment, subjecting the second film after the heat treatment to a reduction treatment, forming a third film made of a ferroelectric material on the second film, and forming a fourth film made of a second metal on the third film.

20 Claims, 23 Drawing Sheets

FOREIGN PATENT DOCUMENTS

| | | |
|---|---|---|
| JP | 2003-092391 A | 3/2003 |
| JP | 2003-209179 A | 7/2003 |
| JP | 2003-264187 A | 9/2003 |
| JP | 2003-298136 A | 10/2003 |
| JP | 2003-318371 A | 11/2003 |
| JP | 2004-095638 A | 3/2004 |
| JP | 2004-153006 A | 5/2004 |
| JP | 2005-108876 A | 4/2005 |
| JP | 2005-159165 A | 6/2005 |
| WO | 20051036612 A2 | 4/2005 |

\* cited by examiner

SEMICONDUCTOR DEVICE MANUFACTURING METHOD

CROSS-REFERENCE TO RELATED APPLICATIONS

This application is based upon and claims the benefit of priority of the prior Japanese Patent Application No. 2008-219353, filed on Aug. 28, 2008 the entire contents of which are incorporated herein by reference.

FIELD

The present invention relates to a manufacturing method of a semiconductor device including a ferroelectric capacitor and, more specifically, to a manufacturing method of a ferroelectric memory including a ferroelectric capacitor element and a memory cell transistor for keeping stored details formed on a semiconductor substrate.

BACKGROUND

With the recent advancement of digital technologies, there has been a trend toward processing or storing a large amount of data at high speed. There thus has been a demand for a semiconductor device with a high degree of integration and a high level of performance for use in electronic equipment.

To meet such a demand, in order to achieve a high degree of integration for a semiconductor memory device, e.g., DRAM (Dynamic Random Access Memory), research and development is recently in progress popularly for using a ferroelectric material or a high-permittivity material to a capacitor insulating film of the capacitor element configuring the DRAM as alternatives to silicon oxide and silicon nitride that have been previously used. Such a semiconductor memory device includes a flash memory and a ferroelectric memory (FeRAM), which are each a nonvolatile memory not losing stored information even if power is turned off.

The FeRAM is provided with a floating gate, and stores information in the floating gate by the accumulation of charge being the representation of the information, for example. The floating gate is embedded in a gate insulating film of an Insulated Gate Field Effect Transistor (IGFET). With such a configuration of the FeRAM, for writing and erasing of information, there needs to provide a flow of tunnel current to pass through the insulating film, thereby requiring a relatively high level of voltage. Moreover, for operating a readable/writable nonvolatile RAM with a lower level of voltage at a higher speed, research and development is actively in progress for using, as a capacitor insulating film, a ferroelectric film having spontaneous polarization characteristics.

The FeRAM performs storage of information utilizing the hysteresis characteristics of the ferroelectric material used to configure the ferroelectric capacitor. The ferroelectric capacitor is of a configuration in which a ferroelectric film is sandwiched between a pair of electrodes, i.e., upper and lower electrodes. Such a ferroelectric capacitor is known to exhibit polarization depending on the level of voltage applied to the electrodes, and exhibit spontaneous polarization even if the voltage application is stopped. Accordingly, information can become available for reading therefrom by detecting inversion of the spontaneous polarization as a result of inversion of the applied voltage. Such a FeRAM operates with a lower level of voltage compared with a flash memory, thereby enabling high-speed writing with lower power consumption. In the previous logic technology, a FeRAM-combined logic chip (SOC: System On Chip) has been recently under study for use with an IC card, for example.

There is also a demand for the FeRAM to have a much higher degree of integration and a much higher level of performance, and the reduction of a cell area is expected to be required from now on. For the reduction of a cell area, adopting the stack configuration as an alternative to the previous planar configuration is known to be effective. Note here that, in the stack configuration, a capacitor is formed directly above a plug, i.e., contact plug, formed on the drain of a transistor configuring a memory cell.

In a FeRAM of the previous stack configuration, a ferroelectric capacitor is configured by laminating a barrier metal, a lower electrode, a ferroelectric film, and an upper electrode in this order directly above a conductive plug made of W (tungsten). The barrier metal serves to prevent oxidation of the conductive plug. The barrier metal and the lower electrode are generally formed by a combination of two or more films selected from a TiN film, a TiAlN film, an Ir film, an $IrO_2$ film, a Pt film, and an SRO ($SrRuO_3$) film.

The ferroelectric film configuring the ferroelectric capacitor in the FeRAM is formed by a lead zirconate titanate (PZT), a Bi layer-structured compound such as $SrBi_2Ta_2O_9$ (SBT, Y1), $SrBi_2$ (Ta, Nb)$_2O_9$ (SBTN, YZ), $Bi_4Ti_3O_9$, (Bi, La)$_4Ti_3O_{12}$, and $BiFeO_3$, or others. Such a ferroelectric film is formed by a sol-gel method, sputtering, and Metal Organic Chemical Vapor Deposition (MOCVD), for example.

For increasing the electrical characteristics of a ferroelectric memory such as FeRAM, and for increasing the product yield thereof, the film made of the ferroelectric material needs to be controlled to ensure a uniform crystal orientation thereof. Such crystal orientation of the ferroelectric film is largely affected by the crystal orientation of the lower electrode. Accordingly, if the lower electrode is ensured to have a uniform crystal orientation, the ferroelectric film can be also ensured to have a uniform crystal orientation. As such, in order to manufacture a ferroelectric memory with improved electrical characteristics and a high product yield, a uniform crystal orientation of the lower electrode is needed.

The lower electrode of a previous ferroelectric capacitor of the stack configuration is known to be in a lamination structure of Pt, $IrO_2$, and Ir in this order from above. Such a technology is described in Japanese Laid-open Patent Publication No. hei09-22829, for example.

For improving the crystallinity of the lower electrode, forming a lamination structure of Ir, Iro, Pt, PtO, and Pt in this order from below has been also under study. The technology related thereto is found in Japanese Laid-Open Patent Publication No. 2003-92391, and in Japanese Laid-open Patent Publication No. 2004-153006, for example. With such a lamination structure, the Ir film is preferably formed with the thickness of 200 nm or thicker for preventing oxidation of a conductive plug. With such a thick Ir film, however, etching will become difficult.

For increasing the stability against oxygen, a study has been made to use precious metal such as Ir, $IrO_x$, Pt, Pd, $PdO_x$, and Au, or conductive oxide for the lower electrode, and to form the lower electrode with the film thickness of about 30 nm to 100 nm. The technology related thereto is found in Japanese Laid-open Patent Publication No. 2003-318371, for example.

Another type of capacitor is known to have a lamination structure including a lower electrode formed on a contact layer, a first dielectric film formed on the lower electrode, a floating electrode formed on the first dielectric film, a second dielectric film formed on the floating electrode with a different orientation direction from the first dielectric film, and an upper electrode formed on the second dielectric film. With such a structure, the contact layer is exemplified by those made of $TiO_x$, Pt, Ti, $PtO_x$, $IrO_x$, $ZrO_x$, TiN, TiAlN, and others. The technology related thereto is found in Japanese Laid-open Patent Publication No. 2003-209179, for example.

The lower or upper electrode may be of a lamination structure with a plurality of films. The lamination structure in this case includes a selective layer, e.g., oxygen barrier layer, an oxygen-source layer, e.g., conductive oxide film, a precious-metal film, or a conductive oxide film, for example. The technology related thereto is found in Japanese Laid-open Patent Publication No. 2000-357777.

An electrode with high adhesion properties is known to have a lamination structure including a first conductive film (IrO), a second conductive film (Ir) formed on the first conductive film, and a third conductive film (Pt) formed on the second conductive film. The technology related thereto is found in Japanese Laid-open Patent Publication No. 2000-91539, for example. Another lamination structure is also developed, i.e., a conductive plug is formed thereon with, in this order, an adhesive film (Ti), a diffusion barrier film (e.g., Ir, or Ru), a metal oxide film ($IrO_2$, $RuO_2$, LSCO, and SRO), and a heat-resistance metal film (Ir, Pt, Ru, Rh, Os, and Pa). The technology related thereto is found in Japanese laid-open Patent Publication No. 2001-111007, for example.

Another type of lamination structure is also known, i.e., an oxygen barrier film is laminated on a lower electrode for preventing diffusion of oxygen. Such a lamination structure is $IrO_2$/Ir/TiAlN/TiN, for example. The technology related thereto is found in Japanese Laid-open Patent Publication No. 2005-159165, for example. The lower electrode is also known to have a lamination structure of TiAlN, Ti, and Pt in this order. The technology related thereto is found in Japanese Laid-open Patent Publication No. 2004-95638, for example. Note here that when a film of Ir is used to an electrode, the fatigue properties with a film of PZT (lead zirconate titanate) formed on the electrode are affected better compared with the film of Pt formed on the electrode. The technology related thereto is found in Japanese Laid-open Patent Publication No. 2000-164818, for example.

With the lamination structure of a lower electrode, it is considered preferable to include at least an Ir layer like Ir/Pt/Ir, Ir/Pt, or Pt/Ir. The technology related thereto is found in Japanese Laid-open Patent Publication No. 2003-298136, for example.

For the purpose of preventing oxidation of a conductive layer configuring a lower electrode, the conductive film may be formed thereon with a precious-metal film, and the precious-metal film may be formed thereon with a strong feeder film. The precious-metal film in this case is formed to be in a lamination structure of at least two or more layers. The technology related thereto is found in Japanese Laid-open Patent Publication No. hei11-145418, for example.

A dielectric capacitor is known to be manufactured by forming a Pt-made lower electrode film on a contact film, by forming a dielectric film on the lower electrode film, and then by forming an upper electrode on the dielectric film. The technology related thereto is found in Japanese Laid-open Patent Publication No. 2002-151662, for example. Herein, when a diffusion barrier film made of a metallic substance is formed between the lower electrode film and the dielectric film, any possible diffusion of elements can be prevented therebetween. The technology related thereto is found in Japanese Laid-open Patent Publication No. hei06-326270, for example.

A semiconductor memory device is known to be a capacitor element in which a conductive plug is provided to an interlayer insulating film formed on a semiconductor substrate, and an electrode for connection to the conductive plug is formed on the interlayer insulating film. The electrode is provided with an iridium oxide film for use as an oxygen barrier film. This iridium oxide film is configured by a plurality of layers varying in average particle diameter of crystal. For example, among a plurality of layers configuring the iridium oxide film, any of those located upper may so set as to have the average crystal particle diameter of ½ or smaller than the film thickness thereof, and to have the average crystal particle diameter smaller than that of the other layers therebeneath. The technology related thereto is found in Japanese Laid-open Patent Publication No. 2003-51583, for example.

As an alternative lamination structure, a lower electrode may be configured by an oxide layer, and the oxide layer is formed thereon with a metal film made of Ir or Ru. The metal film made of Ir or Ru may be formed thereon again with another oxide layer. The technology related thereto is found in Japanese Laid-open Patent Publication No. hei11-243179, for example. A previous electrode is of a lamination structure of any or some of Pt, Ir, Ru, $IrO_2$, and $RuO_2$, or a mixture thereof. The technology related thereto is found in Japanese Laid-open Patent Publication No. 2005-108876, for example.

When a lower insulating film is formed between a lower conductive film and a dielectric film, a leak current of the dielectric film can be reduced to a further degree. The technology related thereto is found in Japanese Laid-open Patent Publication No. 2003-264187, for example. As another lamination structure, it is known to perform sputtering to an $IrO_x$ film on an Ir film for use as a lower electrode before annealing it in an oxygen atmosphere, and form a PZT film thereon. In this case, the Ir film is formed with a temperature of 450° C. or higher, and the $IrO_x$ film is formed with a temperature equal to or lower than the temperature of forming the Ir film, e.g., 300° C. or higher. The technology related thereto is found in Japanese Laid-open Patent Publication No. 2003-68991, for example.

For forming the PZT film, a lower electrode of $IrO_2$ or others may be formed first, and then the resulting structure may be subjected to rapid thermal annealing (RTA). By annealing the lower electrode in an inert atmosphere, the PZT (111) film can be improved in intensity of orientation and switching charge (Qsw). The technology related thereto is found in Japanese Laid-open Patent Publication No. 2000-91551, for example.

Note here that, for forming the $IrO_2$ film of the lower electrode, it is known that the Qsw is affected by a partial pressure ratio between an iridium flux and oxygen. The technology related thereto is found in Japanese Laid-open Patent Publication No. 2000-91270, for example.

For manufacturing a ferroelectric memory with satisfactory electrical characteristics with a high product yield, the crystal orientation of the ferroelectric material needs to be made uniform. The problem here is that, however, if a ferroelectric film is formed by MOCVD, the resulting ferroelectric film becomes susceptible to the influence of other layers therebeneath in terms of crystal orientation.

SUMMARY

According to one aspect of the invention, a semiconductor device manufacturing method includes forming a first film made of a first metal to an upper portion of a substrate, forming a second film made of an amorphous metal oxide or an microcrystalline metal oxide on the first film, subjecting the second film to a heat treatment, subjecting the second film after the heat treatment to a reduction treatment, forming a third film made of a ferroelectric material on the second film, and forming a fourth film made of a second metal on the third film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

A first embodiment of the invention is described in detail by referring to the accompanying drawings.

FIGS. 1A to 1L are each a cross sectional view of a semiconductor device in a manufacturing process of a first embodiment of the invention. Note here that the semiconductor device of the first embodiment is a semiconductor memory device (ferroelectric memory) having a ferroelectric capacitor of a stack configuration.

Figure 1A:
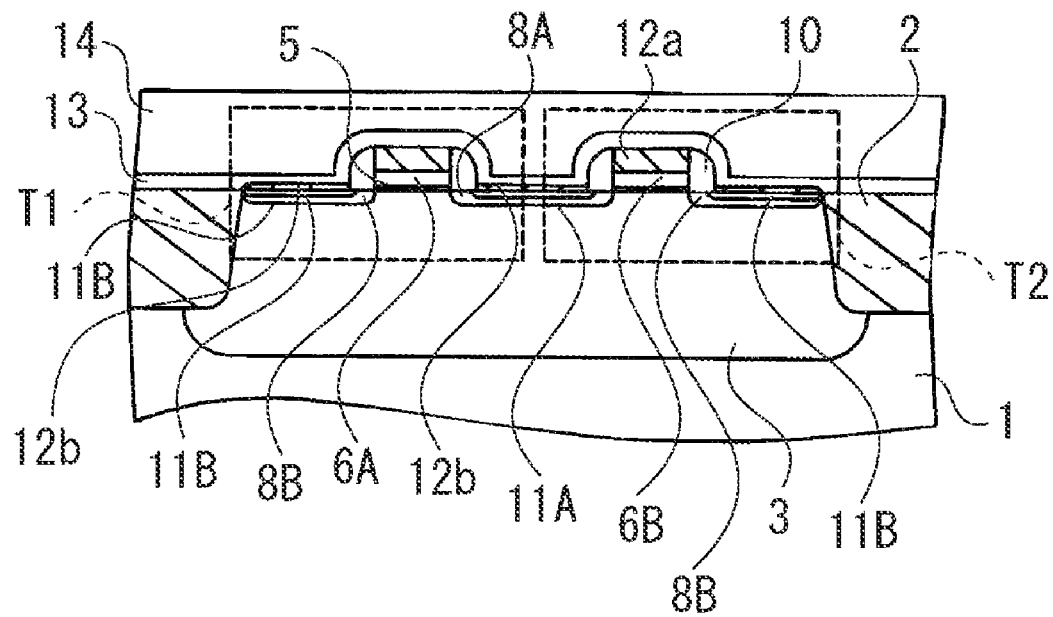
FIGS. 1A to 1P are each a cross sectional view of a semiconductor device of a first embodiment, illustrating manufacturing steps therefor.

Described first is a step procedure for deriving the cross-sectional configuration of FIG. 1A.

First of all, an n- or p-type silicon substrate 1 (semiconductor substrate) is formed with, on its surface, an element isolation insulating film 2 for use to delimit the active area of a transistor. In this embodiment, the element isolation insulating film 2 is formed by Shallow Trench Isolation (STI). With STI, the silicon substrate 1 is formed with a groove in its element isolation area, and the groove is embedded with an insulating film made of silicon oxide, for example. Herein, STI is surely not the only option to form the element isolation insulating film 2, but alternatively, LOCOS (Local Oxidation of Silicon) may be used to form such an insulating film.

Thereafter, a p well 3 is formed by doping p-type impurity, e.g., boron, in the transistor-active area in the memory cell area of the silicon substrate 1. The surface of the transistor-active area is then subjected to thermal oxidation, thereby forming a gate insulating film 5. The gate insulating film 5 in this case is the silicon oxide film as a result of the thermal oxidation, and has a thickness of between about 6 nm to 7 nm.

The silicon substrate 1 is then formed with, on the entire surface thereof, an amorphous or polycrystalline silicon film. The resulting silicon film is then subjected to patterning using lithography, thereby forming gate electrodes 6A and 6B. Herein, the silicon film is assumed as having a thickness of about 50 nm.

The gate electrodes 6A and 6B are formed on the p well 3 to be parallel to each other with a space therebetween, and each of those partially configures a word line. Then by ion implantation using the gate electrodes 6A and 6B as masks, n-type impurity, e.g. phosphorus, is doped to the portions of the surface layer of the silicon substrate 1 on sides of the gate electrodes 6A and 6B, thereby forming source/drain extensions 8A and 8B.

Thereafter, the silicon substrate 1 including the gate electrodes 6A and 6B is formed with an insulating film on the entire surface thereof, and the resulting insulating film is then subjected to etch back so that an insulating side wall 10 is formed only with the portions left intact on the sides of the gate electrodes 6A and 6B. The insulating film is exemplified by a silicon oxide film formed by CVD, for example.

Next, the surface layer of the silicon substrate 1 is subjected again to ion implantation, i.e., is doped with n-type impurity such as arsenic, by using as masks the insulating side wall 10 and the gate electrodes 6A and 6B, thereby forming source/drain areas 11A and 11B (high-concentration impurity diffusion layer) to the silicon substrate 1 on the sides of the gate electrodes 6A and 6B, respectively.

The silicon substrate 1 including the gate electrodes 6A and 6B is formed with a metal film on the entire surface thereof by sputtering. The metal film is preferably made of high-melting metal such as cobalt film, but a metal with a relatively low melting point will also do. By heating this metal film for a reaction with silicon, metal silicide layers 12a and 12b such as cobalt silicide layers are formed on the silicon substrate 1, i.e., specifically over the gate electrodes 6A and 6B, and in the source/drain areas 11A and 11B. Such heat treatment made active the source/drain areas 11A and 11B, and the resistance thereof is accordingly reduced.

Thereafter, the high-melting metal film being unreacted on the element isolation insulating film 2 or others is removed by wet etching.

When this process is completed, two MOS (Metal Oxide Semiconductor) transistors T1 and T2 are formed to every active area of the silicon substrate 1. The MOS transistors T1 and T2 are respectively configured by the gate insulation film 5, the gate electrodes 6A and 6B, the source/drain areas 11A and 11B, and others.

Next, a silicon oxynitride (SiON) film is formed with, on the entire surface thereof, the silicon substrate 1 including the gate electrodes 6A and 6B. The silicon oxynitride film is formed by plasma CVD with a thickness of about 200 nm for use as an oxidation barrier insulating film 13, i.e., cover film. A silicon oxide ($SiO_2$) film is then formed on the oxidation barrier insulating film 13 with a thickness of about 1000 nm for use as a first interlayer insulating film 14. This silicon oxide film is formed by plasma CVD using TEOS (tetra ethoxy silane) gas. Hereinafter, the $SiO_2$ film formed by plasma CVD using TEOS gas as such is referred hereinafter to as TEOS film.

The surface of the first interlayer insulating film 14 is then polished by Chemical Mechanical Polishing (CMP) to make it flat, thereby adjusting the film thickness thereof to be a predetermined value, e.g., about 700 nm. The film thickness here is from the surface of the silicon substrate 1 to the surface of the first interlayer insulating film 14.

Figure 1B:
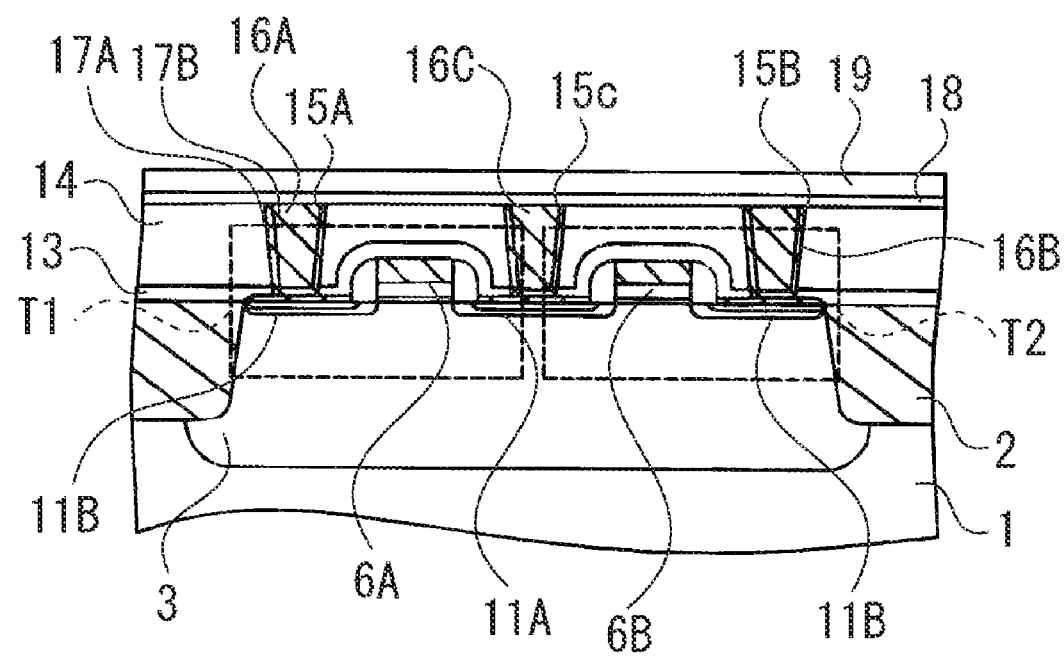

Described next is a step procedure for deriving the cross-sectional configuration of FIG. 1B.

First of all, the oxidation barrier insulating film 13 and the first interlayer insulating film 14 are both subjected to patterning by photolithography, thereby forming contact holes 15A, 15B, and 15C. These contact holes 15A, 15B, and 15C are each assumed to have a depth of reaching the high-melting metal silicide layers 12a and 12b of the respective source/drain areas 11A and 11B, and has a diameter of about 0.25 μm, for example.

Using the contact holes 15A to 15C, conductive plugs 16A, 16B, and 16C are formed for electrical connection to the source/drain areas 11A and 11B. Specifically, to form the conductive plugs 16A, 16B, and 16C to the contact holes 15A to 15C, respectively, the contact holes 15A to 15C are each formed in sequence with, on its inner surface, a 30 nm-thickness titanium (Ti) film and a 20 nm-thickness titanium nitride (TiN) film by sputtering, for example, so that a contact film (glue film) 17A of two-layer lamination structure is formed. The contact film 17A is then made to grow thereon with a tungsten (W) film 17B by CVD. This W film 17B is formed to have a thickness of 300 nm, for example, on the first interlayer insulating film 14, and this W film 17B is used to fill any void of the contact holes 15A to 15C. Thereafter, as to the W film 17B and the contact film 17A grown on the upper surface of the first interlayer insulating film 14, any extra portions thereof are removed by CMP. As such, the contact holes 15A to 15C are respectively formed with the conductive plugs 16A, 16B, and 16C.

For use as a first oxidation barrier film 18, on the first interlayer insulating film 14 and the conductive plugs 16A to 16C, a SiON film is formed with a thickness of 130 nm by plasma CVD, for example. On the resulting first oxidation barrier film 18, for use as a second interlayer insulating film 19, a silicon oxide film is formed with a thickness of 300 nm by plasma CVD using TEOS gas, for example. Herein, as an alternative to the silicon oxynitride (SiON) film, a silicon nitride (SiN) film or an alumina ($Al_2O_3$) film may be formed.

Figure 1C:
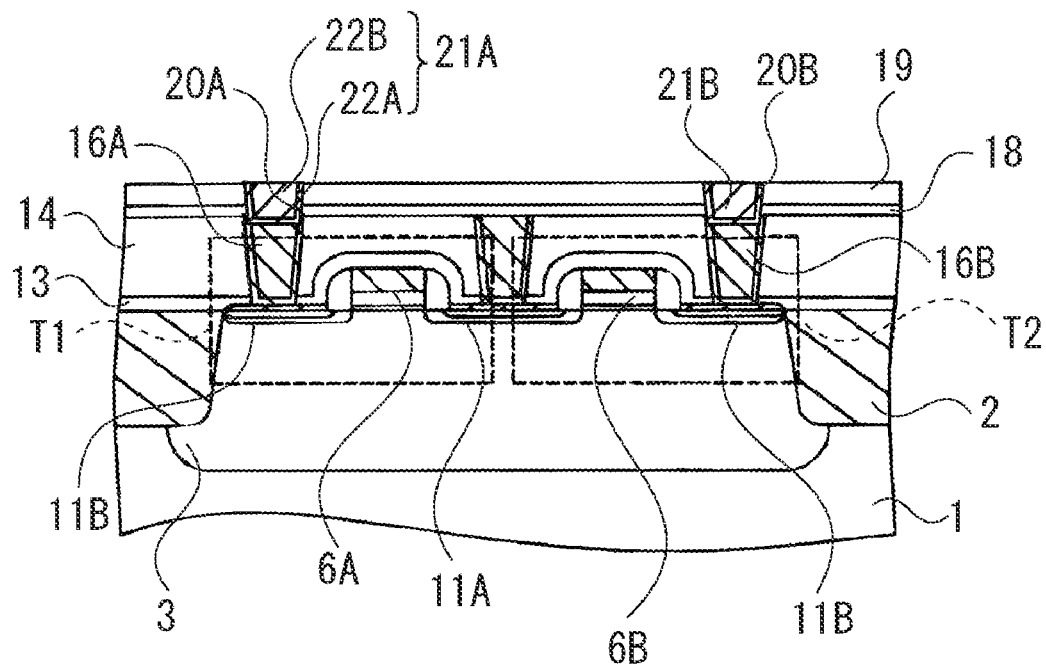

Described next is a step procedure for deriving the cross-sectional configuration of FIG. 1C.

On the second interlayer insulating film 19, a resist film (not illustrated) is coated by spin coating, for example, and then by photolithography, an aperture section is formed on each of the conductive plugs 16A and 16B. Using the resulting resist pattern as a mask, the second interlayer insulating film 19 and the first oxidation barrier film 18 are subjected to dry etching, thereby forming via holes 20A and 20B for connection to the contact holes 15A and 15B, respectively. The via holes 20A and 20B formed as such are embedded with conductive plugs 21A and 21B, respectively. The conductive plugs 21A and 21B are respectively formed by a contact layer 22A and a W layer 22B, which are manufactured by a process similar to that for the conductive plugs 16A and 16B.

As to the contact layer 22A and the W layer 22B formed on the second interlayer insulating film 19, any extra portions are eliminated by CMP polishing. With such CMP, a slurry is used with which the polishing speed for a polishing target, i.e., the contact layer 22A and the W layer 22B, becomes faster than for the base layer, i.e., second interlayer insulating film 19. Such a slurry is exemplified by SSW2000 of Cabot Microelectronics Corporation. For not to leave any trace of polishing on the second interlayer insulating film 19, this CMP polishing is so set as to go thicker than the total thickness of the contact layer 22A and the W layer 22B. That is, the CMP polishing here is over-polishing.

Figure 1D:
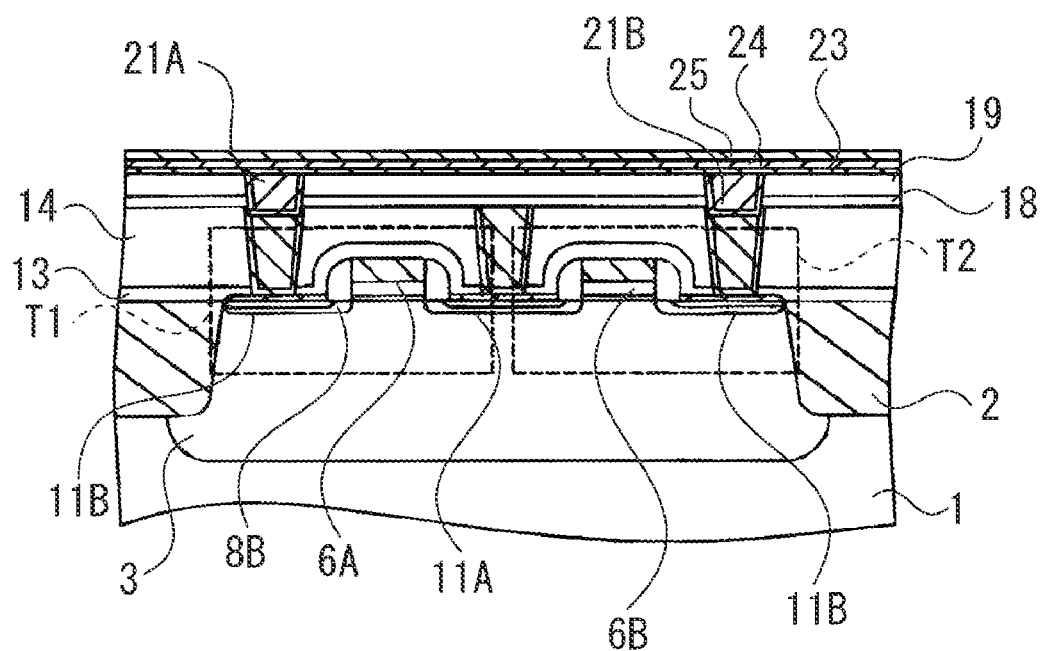

Described next is a step procedure for deriving the cross-sectional configuration of FIG. 1D.

The second interlayer insulating film 19 is subjected to a $NH_3$ plasma treatment so that an NH group is coupled to atoms of oxygen on the surface. This accordingly prevents, even if atoms of Ti are deposited more on the second interlayer insulating film 19, the atoms of Ti from being captured by the atoms of oxygen. As a result, the atoms of Ti become able to freely move on the surface of the second interlayer insulating film 19. That is, the Ti film is allowed to show any predetermined crystal orientation on the second interlayer insulating film 19, e.g., allowed to achieve the (002) orientation by itself, thereby being able to improve the flatness of the upper surface thereof.

Note here that the ammonia plasma treatment is performed using a parallel-plate-type plasma treatment device in which an opposing electrode is disposed at a position away from the silicon substrate 1 by about 9 mm (350 mils), for example. The requirements for such a treatment are to provide ammonia gas with a flow rate of 350 sccm into a container kept at a substrate temperature of 400° C. in the pressure of 266 Pa (2 Torr), for example. Such requirements are also to provide, for 60 seconds, high frequencies of 13.56 MHz with the power of 100 W to the side of the silicon substrate 1, and to provide high frequencies of 350 kHz with the power of 55 W to the opposing electrode.

Then in a sputtering device in which the distance between the silicon substrate 1 and the target is set to 60 mm, in an argon (Ar) atmosphere of 0.15 Pa, a supply of 2.6-kW sputtering DC (Direct Current) power is made for 5 seconds at a substrate temperature of 20° C. With such a power supply, a Ti film with the intense (002) orientation is formed on the second interlayer insulating film 19 and the conductive plugs 21A and 21B with a thickness of about 20 nm.

Thereafter, the Ti film is subjected to RTA in a nitride atmosphere at a substrate temperature of 650° C. for 60 seconds, thereby changing the Ti film to a base conductive film 23 being a TiN film with the (111) orientation.

Next, on the resulting base conductive film 23, a titanium aluminum nitride (TiAlN) film is formed for use as an oxidation diffusion barrier film 24. The TiAlN film is formed to have a thickness of 100 nm by reactive sputtering using a target alloy of Ti and Al, for example. The requirements for such film formation include the pressure of 253.3 Pa, the substrate temperature of 400° C., and the sputtering power of 1.0 kW in a mixed atmosphere containing Ar gas with the flow rate of 40 sccm, and nitride gas with the flow rate of 10 sccm, for example.

Then on the oxidation diffusion barrier film 24, a lower electrode film 25 is formed for use as a first conductive film. The lower electrode film 25 is made of a precious metal or Ir with a thickness of between 60 nm and 100 nm in an Ar atmosphere with the pressure of 0.2 Pa, at a substrate temperature of 450° C., and with the sputtering power of 0.3 kW. The lower electrode film 25 may be made of Ru, Rh, or Pd as an alternative to Ir.

The oxidation diffusion barrier layer 24 and the lower electrode film 25 are set to the (111) orientation, with a priority, in accordance with the crystal orientation angle of the base conductive film 23 made of TiN.

Figure 1E:
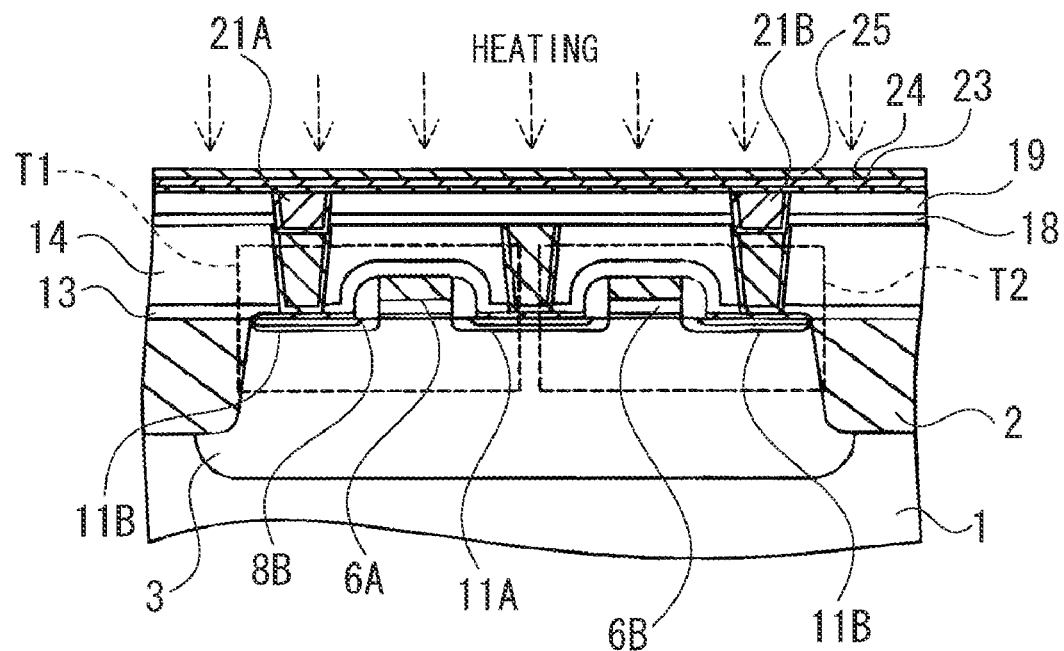

Thereafter, as illustrated in FIG. 1E, in the inert atmosphere, e.g., Ar atmosphere, the lower electrode film 25 is subjected to RTA at a temperature of between 650° C. and 750° C. for 60 seconds. As a result of this heat treatment, the crystallinity of the Ir film is improved, and the adhesion properties are improved in the base conductive film 23, the oxidation diffusion barrier film 24, and the lower electrode film 25.

Figure 1F:
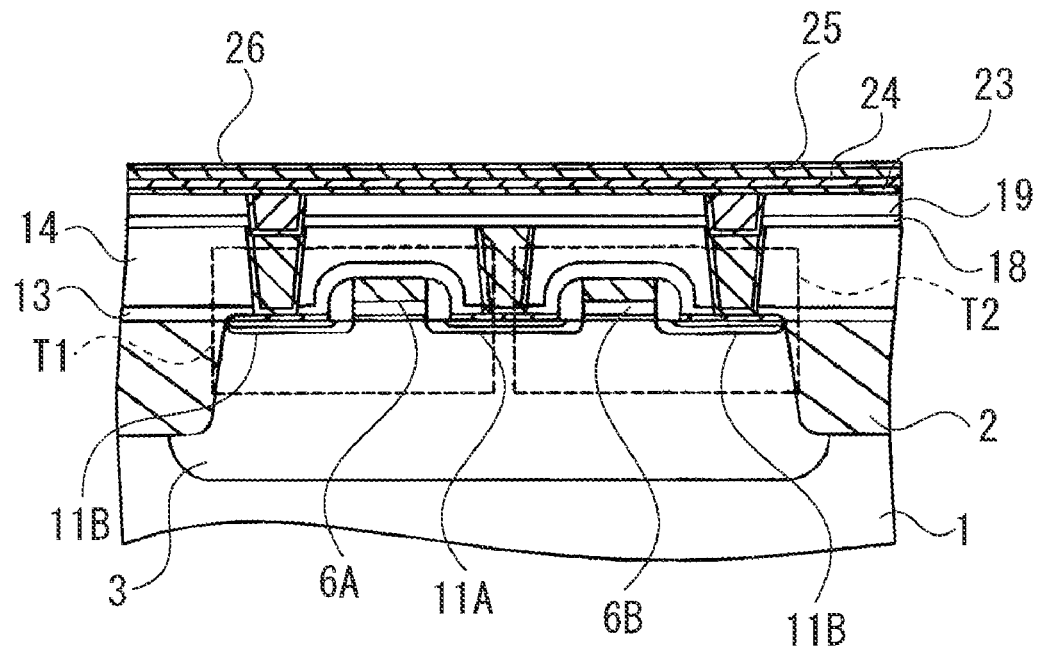

Next, as illustrated in FIG. 1F, the lower electrode film 25 is formed thereon with a conductive oxide film 26 by sputtering. The conductive oxide film 26 is made of a precious-metal film, e.g., $IrO_x$ film, with a thickness of between 5 nm and 50 nm. In this case, the conductive oxide film 26 is an oxidation result of the metal configuring the lower electrode film 25. The requirements for forming the $IrO_x$ film include a mixed atmosphere containing Ar gas and oxygen gas, for example, the pressure of 0.11 Pa, the substrate temperature of between 10° C. and 100° C., more preferably between 50° C. and 75° C., and the sputtering power of 1 kW. A target for sputtering here is iridium.

The conductive oxide film 26 formed with such requirements is at least in the state of amorphous or microcrystal, i.e., in either state of amorphous or microcrystal, or in the state of mixture thereof.

As to the $IrO_x$ film, the degree of oxidation and crystallinity thereof affect the crystallinity of a ferroelectric film (PZT film) to be formed thereon. Such a degree of oxidation and crystallinity of the $IrO_x$ film are affected by the ratio of oxygen at the time of film formation in a mixed atmosphere containing Ar gas and oxygen gas, the film-forming rate, i.e., sputtering power, the film-forming temperature, and the film thickness. When the $IrO_x$ film is too high or low in the degree of oxidation, oxidation occurs again at the time of a heat treatment. This easily enhances the abnormal crystal growth, and results in a difficulty in subjecting the conductive oxide film 26 uniformly in a reduction treatment process, which will be described later.

In consideration thereof, as the film-forming requirements for the $IrO_x$ film, Ar gas and oxygen ($O_2$) gas are directed into the film-forming atmosphere with the flow rates of 188 sccm and 12 sccm, respectively, for example. The film-forming requirements also include the film-forming power of 0.5 kW, the film-forming time of 15 seconds, the film-forming rate of 1.6 nm/second, and the film-forming temperature of 60° C. In this example, the flow rate ratio $P_{O2}$ of $O_2$ is 6 flow rate % in the total sum of the flow rates of Ar gas and $O_2$ gas. The $IrO_x$ film to be formed with such film-forming requirements is assumed to have a thickness of 25 nm. The film-forming requirements for such an $IrO_x$ film will be described in more detail later when a PZT-film forming process is described.

Figure 1G:
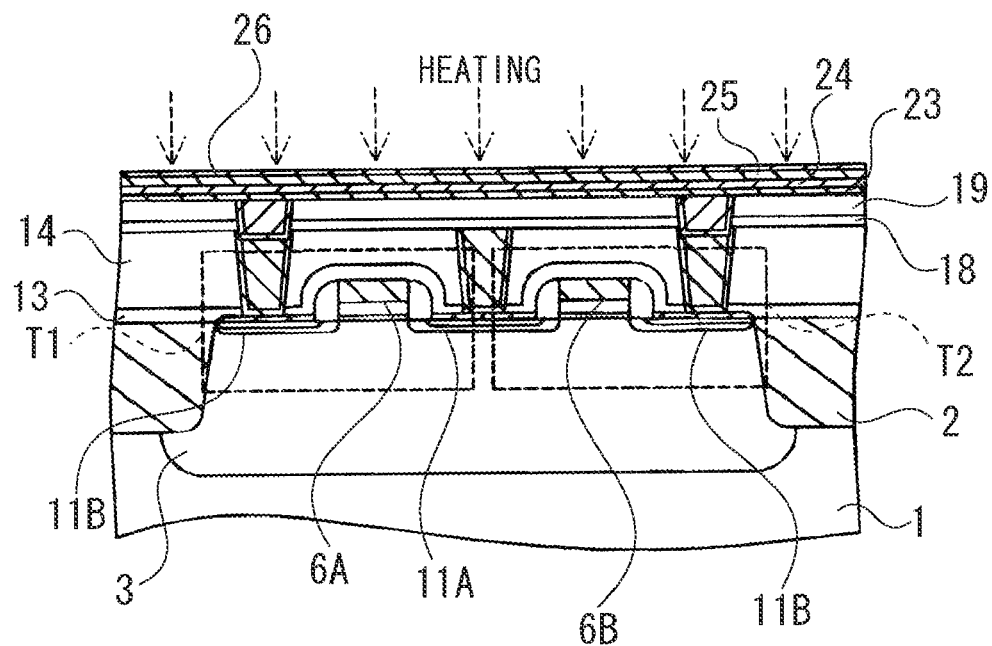

Next, as illustrated in FIG. 1G, the $IrO_x$ film formed with the film-forming requirements as above is heated by RTA in the atmospheric pressure or in the pressure range of 1 Pa to the atmospheric pressure, thereby crystallizing the $IrO_x$ film. The heating temperature is preferably 600° C. or higher but 750° C. or lower. Such a heating temperature will be described in more detail also later when the PZT-film forming process is described.

Figure 1H:
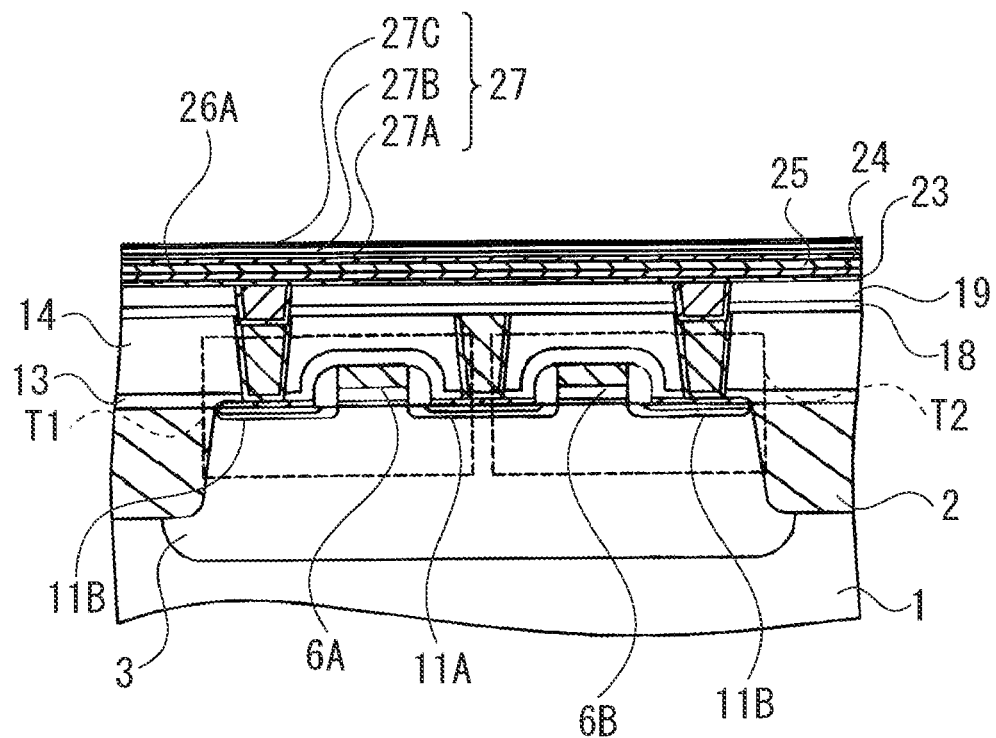

Thereafter, as illustrated in FIG. 1H, the $IrO_x$ film being the conductive oxide film 26 is formed thereon with a PZT film for use as a first ferroelectric film 27. In this embodiment, for use as the PZT film, an initial layer 27A and a core layer 27B are formed first by MOCVD, and then a surface layer section 27C is formed on the core layer 27B by sputtering.

Figure 2:
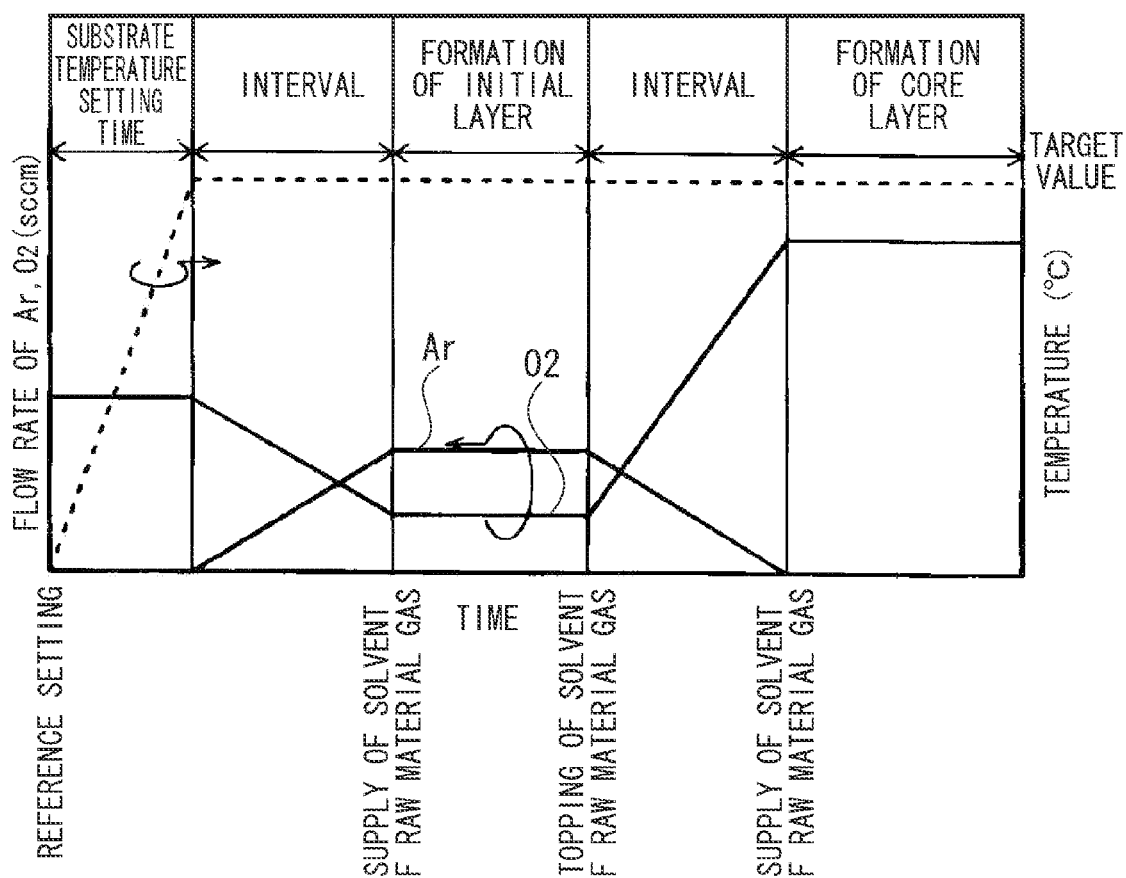
FIG. 2 is a timing chart of flow rate control over Ar gas and $O_2$ gas.

More in detail, the silicon substrate 1 formed with the conductive oxide film 26 is placed in the chamber of a MOCVD device. Then, as illustrated in FIG. 2, a flow of $O_2$ gas is directed into the chamber, e.g., 2000 sccm of gas, and the temperature of the silicon substrate 1 is increased to a target value, i.e., the film-forming temperature for the initial layer 27A and the core layer 27B in the first ferroelectric film 27. Note here that, during the increase of temperature as such, no oxidation occurs again to the $IrO_x$ film, i.e., the conductive oxide film 26, having been through with crystallization by the heat treatment.

When the temperature reaches the target value, as illustrated in FIG. 2, before starting to form the initial layer 27A with the supply of raw material gas of the first ferroelectric film 27, a time interval is provided to change the respective flow rates of Ar gas and $O_2$ gas to the values needed for formation of the initial layer 27A. Specifically, the flow rate of Ar gas is changed to 1375 sccm, and the flow rate of $O_2$ gas is changed to 625 sccm. The ratio of oxygen gas in this case is 0.33. Herein, the ratio of oxygen gas denotes the actual proportion of the amount of oxygen with respect to the amount of oxygen needed for causing a reaction with the raw material of organic metal used for forming the PZT film.

After the completion of flow rate adjustment of the Ar gas and the $O_2$ gas in the time interval, raw material gas of the first ferroelectric film 27 is directed into the chamber, and the process of forming the initial layer 27A is started.

The raw materials of the PZT film, i.e., Pb, Zr, and Ti, are each made ready in advance in the form of liquid. In this example, the raw material of Pb is tetrakis demethylheptane-dionate lead $Pb(DMHD)_2$, the raw material of Zr is tetrakis demethylheptane-dionate zirconium $Zr(DMHD)_4$, and the raw material of Ti is bisisopropoxybis dipivaloylmethanate titanium $Ti(O-iPr)_2(DPM)_2$. These raw materials are respectively dissolved in a solvent of butyl acetate with the concentration of 0.2 mol/L (mol/liter), 0.1 mol/L, and 0.1 mol/L, respectively, thereby producing the raw materials of Pb, Zr, and Ti in the form of liquid. The gas of these raw materials, i.e., raw material gas, is so controlled that the total flow rate thereof, i.e., sum of the flow rate of Pb gas, the flow rate of Zr gas, and the flow rate of Ti gas, always remains 1.2 mL (milliliter)/minute.

To be more specific, such liquid raw materials are supplied to a vaporizer in the MOCVD device while being controlled in terms of flow rate thereof. The deposition rate of the PZT film may be controlled by the flow rate of each of the liquid raw materials. In order to control the film-forming rate to be 0.04 nm/second, for example, together with the solvent of butyl acetate with the flow rate of 0.95 mL/minute, the liquid raw materials of Pb, Zr, and Ti are provided, for vaporization, with the flow rate of 0.1 mL/minute, 0.07 mL/minute, and 0.08 mL/minute, respectively. On the other hand, in order to control the deposition rate to be 0.17 nm/second, together with the solvent of butyl acetate with the flow rate of 0.30 mL/minute, the liquid raw materials of Pb, Zr, and Ti are provided, for vaporization, with the flow rate of 0.26 mL/minute, 0.34 mL/minute, and 0.30 mL/minute, respectively.

With such flow rates, the raw material gas is directed into the chamber, and the initial layer 27A is formed with a thickness of between 2.5 nm and 10 nm. In the stage of forming the initial layer 27A, the crystallized conductive oxide film 26 is subjected to a reduction treatment uniformly by the solvent components in the raw material gas. As a result, the conductive oxide film 26 is reformed to a second conductive film 26A whose crystal particles are uniform and small in size.

In this stage, the ratio of oxygen in the chamber is 0.33, and this value means that the amount of $O_2$ gas is not enough considering the amount needed for a reaction with raw material components of an organic metal such as Pb. Therefore, the raw material components of organic metal in the raw material gas react not only to the $O_2$ gas in the chamber but also to the atoms of oxygen in the conductive oxide film 26. As such, at the same time when the initial layer 27A is formed, the conductive oxide film 26 is subjected to a reduction treatment, thereby forming the second conductive film 26A.

Figure 3:
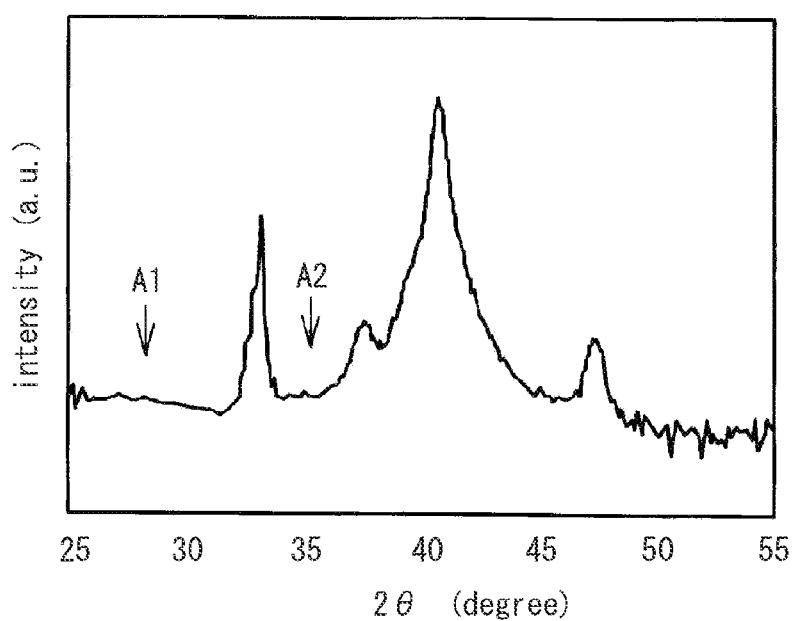
FIG. 3 is a diagram illustrating a result of X-ray diffraction after a reduction treatment of a conductive oxide film.

When X-ray diffraction is performed after the reduction treatment to the conductive oxide film 26 as such, as illustrated in FIG. 3, the $IrO_x$ film does not show any peak that is supposed to appear in the vicinity of arrows A1 and A2. This tells that, as a result of the reduction treatment performed to the $IrO_x$ film in the conductive oxide film 26, an Ir film is formed.

In the second conductive film 26A formed as a result of the reduction treatment performed to the $IrO_x$ film, through control over the orientation of the Ir film configuring the lower electrode film 25, the (111) plane of the Ir film may be oriented with a priority. The second conductive film 26A may be thus formed thereon with the initial layer 27A in which the (111) plane of the PZT film is oriented with a priority. The initial layer 27A preferably has a film thickness of between 2.5 nm and 10 nm. When the initial layer 27A becomes thinner in film thickness than 2.5 nm, the film-forming time is accordingly reduced, thereby resulting in a difficulty to perform a reduction treatment to the conductive oxide film 26. This thus often results in the poor orientation of the initial layer 27A. On the other hand, when the initial layer 27A becomes thicker in film thickness than 10 nm, the PZT film may suffer from an oxygen deficit or others, thereby often reducing the eventual amount of switching charge of the ferroelectric capacitor.

Herein, for deriving the second conductive film 26A made of Ir by performing the reduction treatment to the $IrO_x$ film configuring the conductive oxide film 26, it is important to form the $IrO_x$ film with the requirements appropriate therefor.

When the sputtering power is set to 0.5 kW for use to form the $IrO_x$ film by sputtering, for example, the flow rate ratio of oxygen in a mixed atmosphere containing Ar gas and $O_2$ gas is preferably 4% flow rate or higher but 10% flow rate or lower. When the sputtering power is set to be larger than 0.5 kW, the flow rate ratio of oxygen is preferably increased to a further degree. On the other hand, when the sputtering power is set to be lower than 0.5 kW, the flow rate ratio of oxygen is required to be reduced to a further degree.

The conductive oxide film 26 is preferably formed with a film thickness of between 10 nm and 40 nm. When the conductive oxide film 26 becomes thinner than that, the lower electrode film 25 becomes susceptible to oxidation during the heat treatment to be performed later. On the other hand, when the conductive oxide film 26 becomes thicker than that, the conductive oxide film 26 may not be fully subjected to a reduction treatment in a later reduction treatment process to be executed for forming the initial layer 27A made of PZT.

The conductive oxide film 26 is preferably amorphous or uniformly microcrystalline. If an attempt is made to form the crystalline conductive oxide film 26 at the time of film formation, the resulting film will be hardly uniform in quality in the initial state of film formation. Moreover, the film with the crystalline quality as such is easily susceptible to oxidation again at the time of temperature increase illustrated in FIG. 2, thereby resulting in a difficulty in uniformly subjecting the film to the reduction treatment in the reduction treatment process described above. Therefore, by forming a film being amorphous or substantially uniformly microcrystalline like the conductive oxide film 26, the $IrO_x$ film may be formed uniform when it is exposed in the reducing atmosphere as above, and the reduction treatment performed to the $IrO_x$ film may form an Ir film whose crystal particles are small in size.

With the Ir film formed uniformly with the small-sized crystal particles as such, the PZT film may be increased in crystallinity as described above, and the surface morphology of the PZT film may be improved. This accordingly increases the product yield. At the same time, the interface between the lower electrode film 25 and the ferroelectric film may be formed without fail, and the excellent electrical characteristics may be provided especially at the time of operation with a low level of voltage.

Figure 4A:
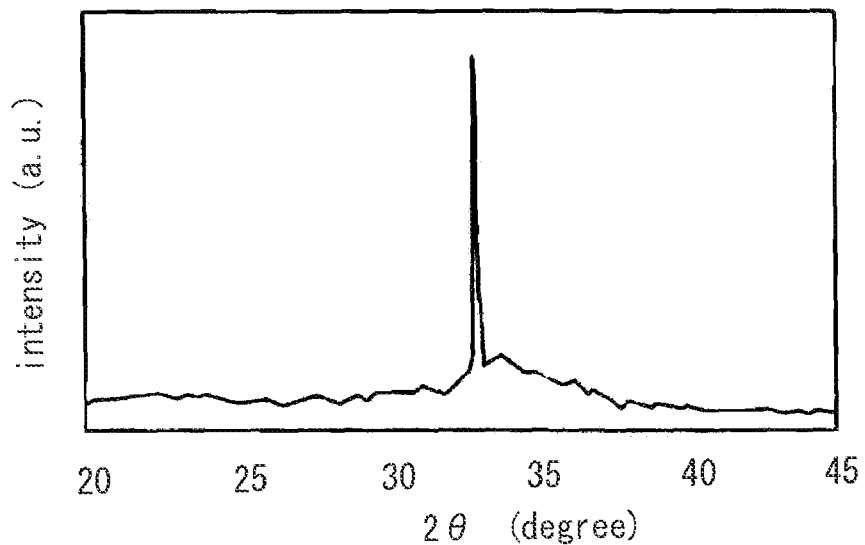
FIG. 4A is a diagram illustrating a result of the X-ray diffraction performed to the conductive oxide film.

In consideration thereof, in this embodiment, the film-forming requirements for the conductive oxide film 26 are set to those as described above. FIG. 4A illustrates the result of X-ray diffraction performed to the conductive oxide film 26 formed with such requirements. In FIG. 4A, only a peak indicating the silicon material of the (200) plane is observed, and no crystal peak of the $IrO_x$ film is observed. This tells that the conductive oxide film 26 is formed to be amorphous or uniformly microcrystalline.

After the conductive oxide film 26 is formed as such, the silicon substrate 1 is subjected to an RTA treatment with a temperature of 600° C. or higher, more preferably a temperature of 700° C. or higher but 750° C. or lower.

When the temperature for the heat treatment is lower than 600° C., it means that oxidation will easily occur abnormally at the time of temperature increase of FIG. 2. On the other hand, when the temperature for the heat treatment becomes higher than 750° C., the transistor characteristics of CMOS will easily show a change from those in the initial state due to the influence of thermal hysteresis. As such, in this embodiment, the temperature for the heat treatment after the formation of the conductive oxide film 26 is set to 650° C. as an example. The pressure in this case is set to be a value of normal pressure or smaller but higher than 0.1 Pa. This accordingly helps uniform crystallization of the $IrO_x$ film in the conductive oxide film 26.

Figure 4B:
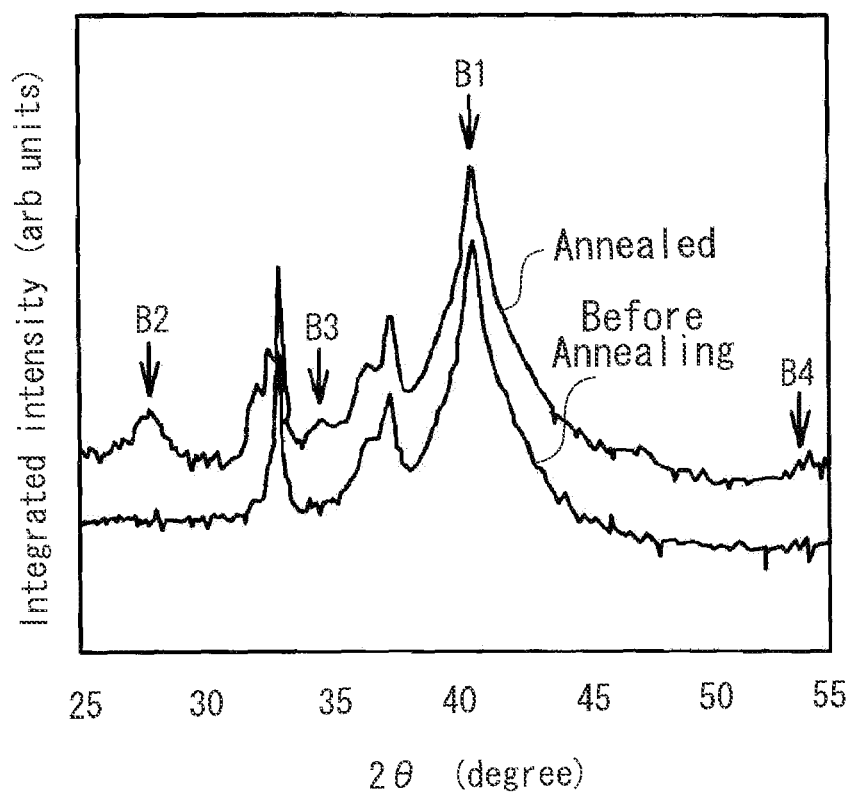
FIG. 4B is a diagram illustrating the result of the X-ray diffraction of the conductive oxide film before and after a heat treatment.

FIG. 4B illustrates the result of XRD (X-ray diffraction) diffraction measurement. Data of such XRD diffraction is about the measurement result derived for the conductive oxide film 26 before and after the heat treatment with the requirements above, i.e., Before Annealing and Annealed. In the measurement result of Before Annealing, only a peak of Ir (111) indicated by an arrow B1 is observed. The peak indicated by the arrow B1 is possibly resulted from the Ir film of the lower electrode film 25 being the base layer. On the other hand, in the measurement result of Annealed, various peaks are observed, i.e., peak of Ir (111) indicated by the arrow B1, peak (28.06°) of Ir (101) indicated by an arrow B2, peak (34.76°) of (110) indicated by an arrow B3, and peak (54.02°) of (211) indicated by an arrow B4. Such measurement results tell that the conductive oxide film 26 is crystallized by the heat treatment.

As described above, after forming the second conductive film 26A and the initial layer 27A, as illustrated in FIG. 2, the induction of the raw material gas is temporarily stopped. Then in a time interval before the resumption of growth of the PZT film, the flow rate of Ar gas and that of $O_2$ gas are changed to the values required for forming the core layer 27B. In this embodiment, the flow rate of the Ar gas is changed to 0 sccm, and the flow rate of the $O_2$ gas is changed to 4500 sccm. The ratio of oxygen in this example is 6.77 times more than the amount of oxygen needed for causing a reaction with the raw material of organic metal. After such flow rate changes of gas, the raw material gas is induced again to the chamber to start forming the core layer 27B. As such, in the stage of forming the core layer 27B, the raw material gas is induced with too much amount of $O_2$ so that the resulting core layer 27B does not create an oxygen deficit that much. Moreover, as is formed on the initial layer 27A oriented along the (111) plane with a priority, the core layer 27B is formed to orient along the (111) plane also with a priority.

Such a PZT-film forming process by MOCVD is executed with the pressure in the chamber of 665 Pa, at a substrate temperature always at 620° C., and with a supply of raw material gas for 620 seconds in total. As a result, the initial layer 27A and the core layer 27B are formed with the total film thickness of 100 nm.

Note here that, for forming the first ferroelectric film 27, preferably, the deposition speed, i.e., film-forming rate, for the initial layer 27A is set to a small value, and the film-forming rate for the core layer 27B to be formed thereafter is set to a relatively high value, e.g., the film-forming rate for the initial layer 27A of 0.1 nm/second or smaller, preferably, 0.05 nm/second or smaller, and more preferably, 0.04 nm/second or smaller. The film-forming rate for the core layer 27B is set to 0.17 nm/second, for example.

When the film-forming rate for the initial layer 27A is larger than 0.1 nm/second, the morphology of the core layer 27B to be formed thereon will be often deteriorated, and the eventual amount of switching charge of the ferroelectric capacitor will be often reduced, i.e., when the initial layer 27A is formed with the film-forming rate of 0.1 nm/second or smaller, the ferroelectric capacitor shows the amount of switching charge of 40 $\mu C/cm^2$, but when the initial layer 27A is formed with the film-forming rate of 0.17 nm/second same as that for the core layer 27B, the ferroelectric capacitor shows the amount of switching charge being small such as 32 $\mu C/cm^2$.

The first ferroelectric film 27 formed as such is flat on the surface. What is better, the film does not look whitish unlike a PZT film in the previous technologies, which is possibly resulted from the morphology being non-uniform.

Considered here again is the influence of, over the crystallinity of the first ferroelectric film 27, the requirements for a heat treatment to be performed after the lower electrode film 25 and the conductive oxide film 26 are formed. After the lower electrode film 25 is formed, the heat treatment is performed in an Ar atmosphere for 60 seconds with a substrate temperature of 650° C. After the conductive oxide film 26 is formed, the heat treatment is performed for 60 seconds with a temperature of 650° C.

Figure 5A:
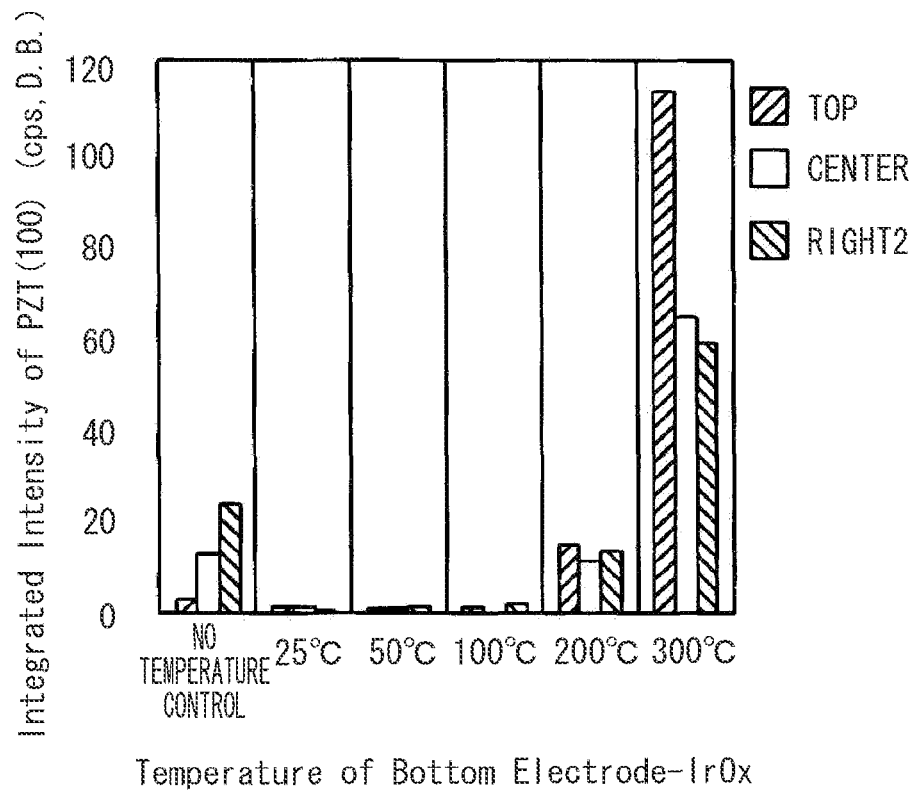
FIG. 5A is a graph illustrating the influence of a film-forming temperature of the conductive oxide film over the crystallinity of the (100) plane of a first ferroelectric film.
Figure 5B:
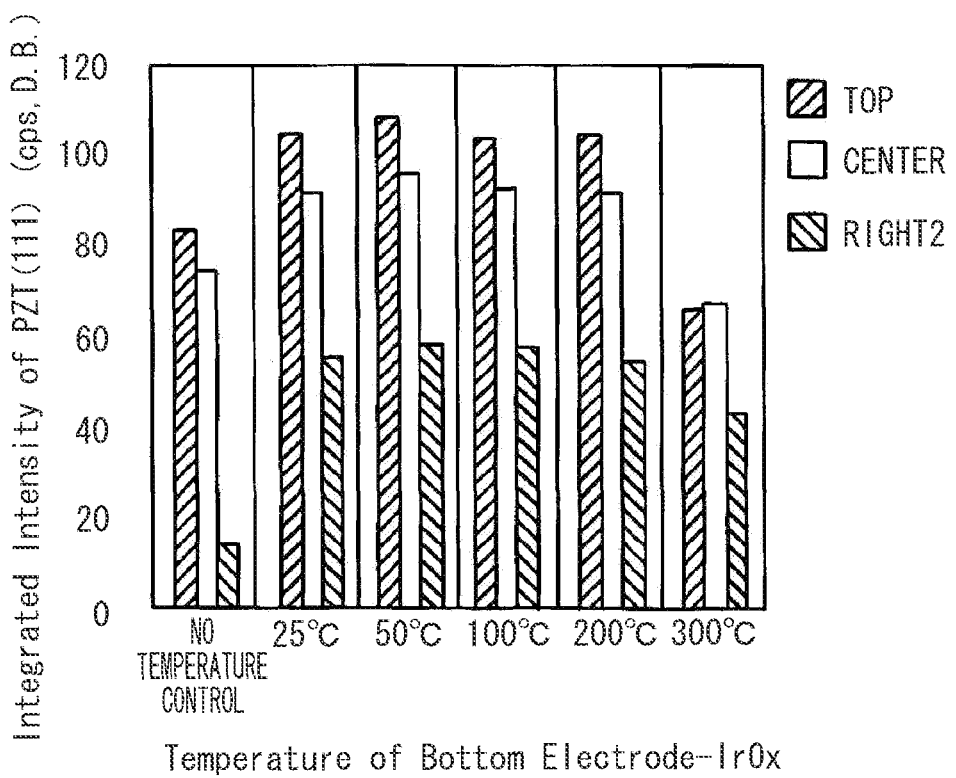
FIG. 5B is a graph illustrating the influence of the film-forming temperature of the conductive oxide film over the crystallinity of the (111) plane of the first ferroelectric film.

FIGS. 5A and 5B each illustrate the study result about the influence of, over the crystallinity of the first ferroelectric film 27, the film-forming temperature for the conductive oxide film 26. After the first ferroelectric film 27 is formed, three portions of the resulting film are subjected to X-ray diffraction, i.e., center portion (Center), top portion (Top), and right portion (Right). With the result, when the film-forming temperature for the conductive oxide film 26 is in a range of 25° C. to 100° C., the (100) plane of the PTZ film in the first ferroelectric film 27 does not show that high intensity of orientation. Although not illustrated, the (101) plane of the PTZ film therein also does not show that high intensity of orientation. Contrary thereto, the (111) plane therein shows the high intensity of orientation with the temperature range of 25° C. to 100° C. Accordingly, with the temperature of between 25° C. and 100° C. for forming the conductive oxide film 26, the resulting first ferroelectric film 27 may include the PZT film oriented along the (111) plane. Note here that the experiment shows that a temperature range of 10° C. to 25° C. is also preferable for forming the conductive oxide film 26.

Figure 6A:
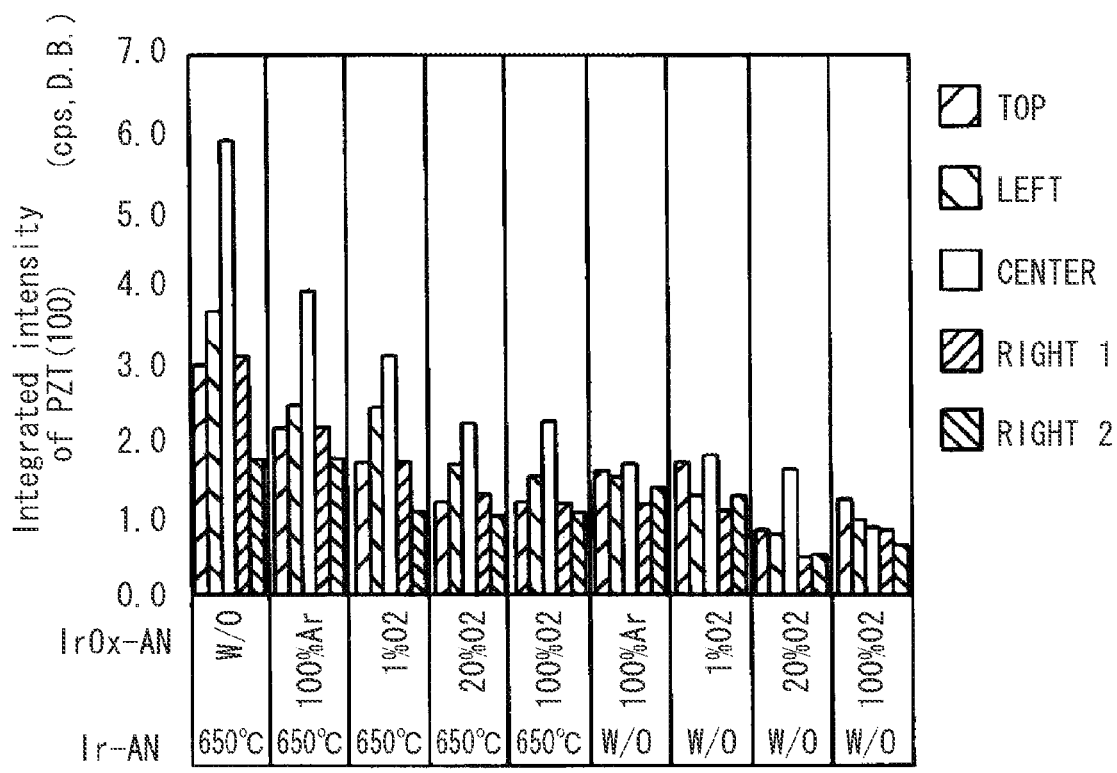
FIG. 6A is a graph illustrating the study result of, using the X-ray diffraction, how heat-treatment requirements for a lower electrode film and a conductive oxide film affect the crystallinity of the (100) plane of a PZT film.
Figure 6B:
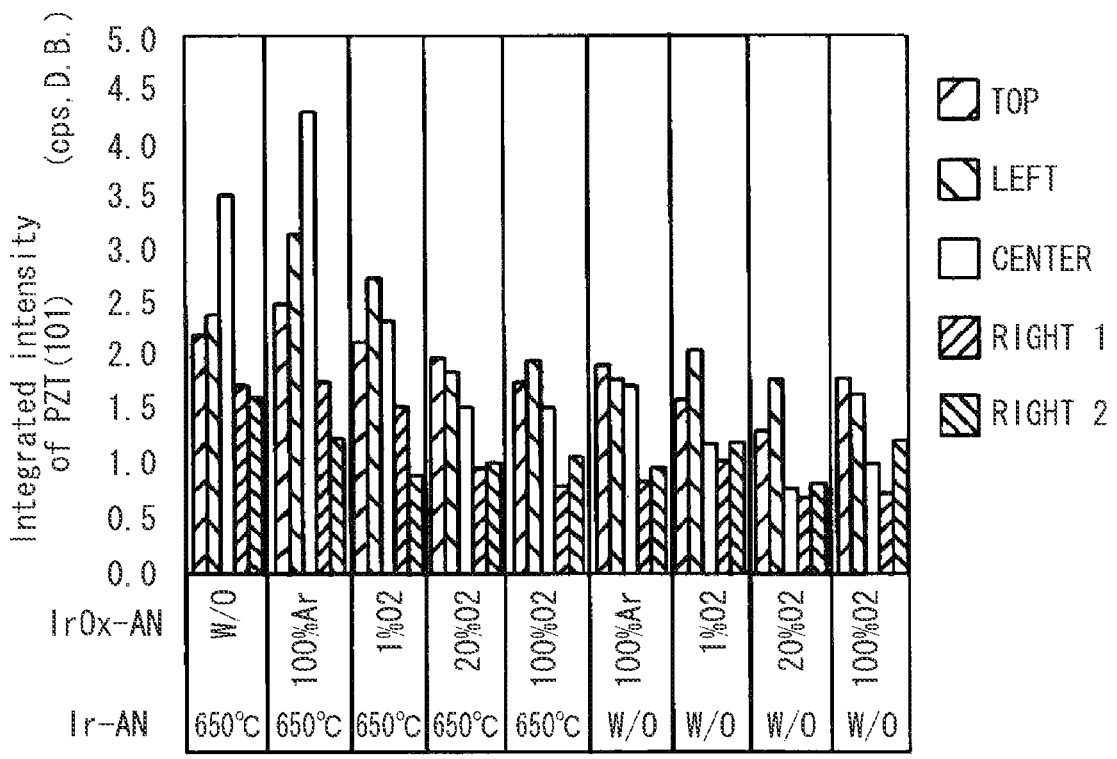
FIG. 6B is a graph illustrating the study result of, using the X-ray diffraction, how the heat-treatment requirements for the lower electrode film and the conductive oxide film affect the crystallinity of the (101) plane of the PZT film.
Figure 6C:
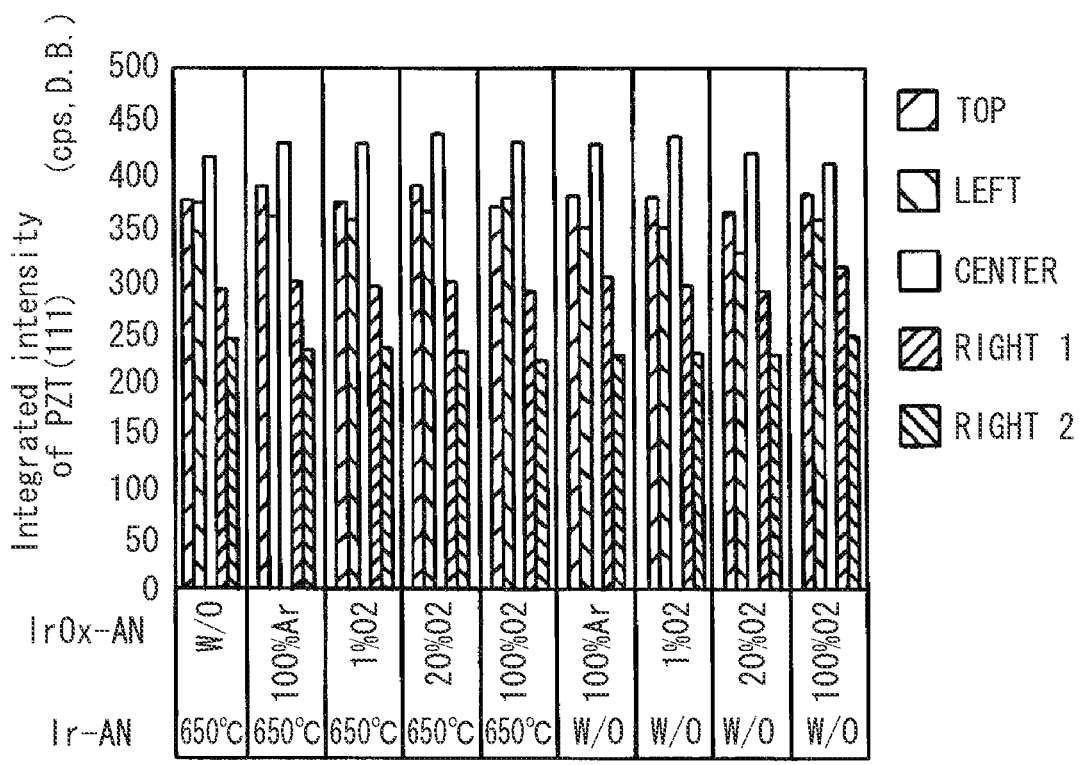
FIG. 6C is a graph illustrating the study result of, using the X-ray diffraction, how the heat-treatment requirements for the lower electrode film and the conductive oxide film affect the crystallinity of the (111) plane of the PZT film.
Figure 6D:
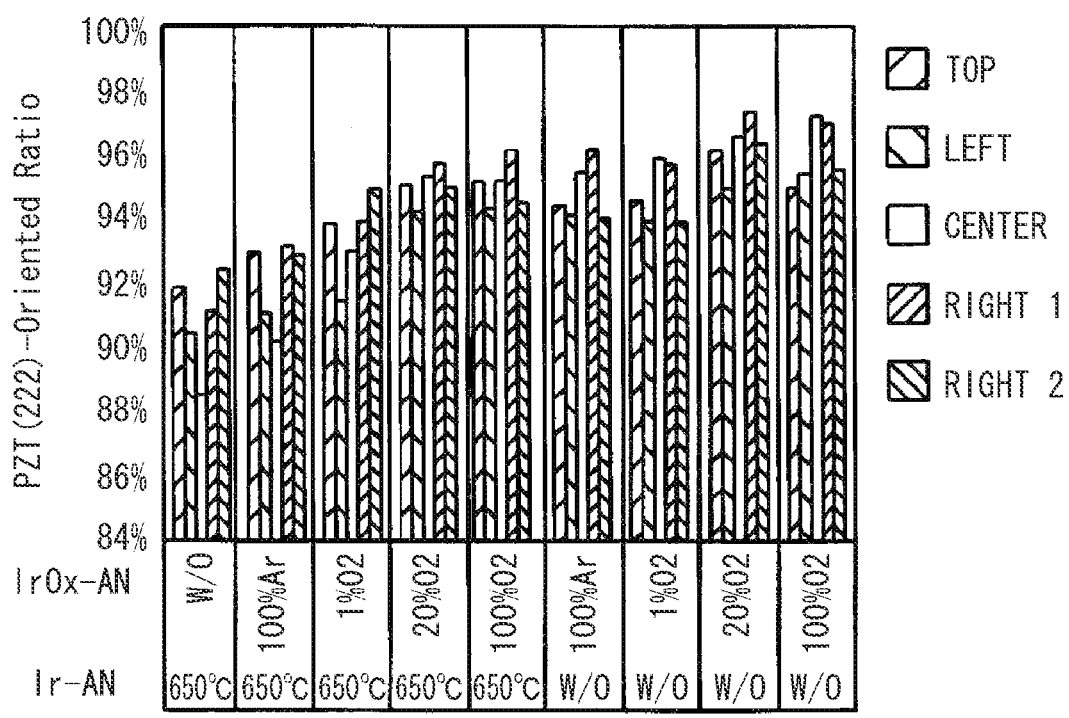
FIG. 6D is a graph illustrating the study result of, using the X-ray diffraction, how the heat-treatment requirements for the lower electrode film and the conductive oxide film affect an orientation factor of the (222) plane of the PZT film.
Figure 6E:
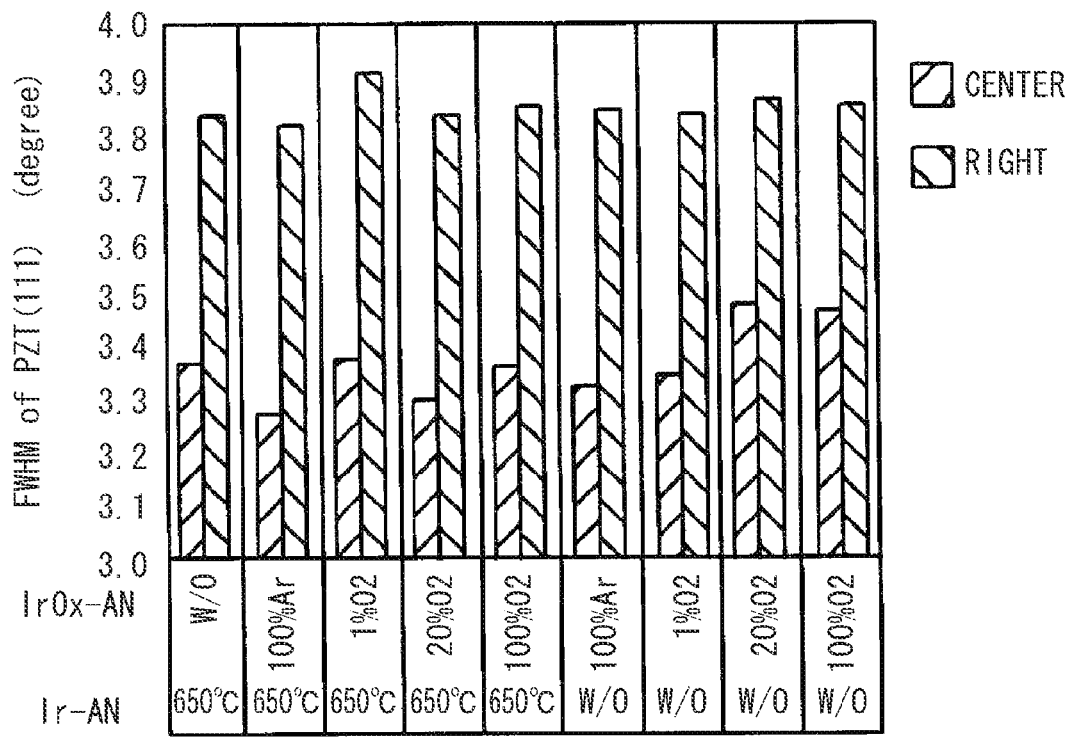
FIG. 6E is a graph illustrating the change of the half-width of an X-ray diffraction peak of the (111) plane of the PZT film by the heat-treatment requirements for the lower electrode film and the conductive oxide film.

Next, FIGS. 6A to 6E each illustrate the study result of, using the X-ray diffraction, the influence of, over the crystallinity of a PZT film, the requirements for a heat treatment to be performed to the lower electrode film 25 and the conductive oxide film 26. In FIG. 6A, the lateral axis indicates the requirements for the heat treatment to be performed to the lower electrode film 25, i.e., "Ir-AN" at the bottom, and the requirements for the heat treatment to be performed to the conductive oxide film 26, i.e., "$IrO_x$-AN" above "Ir-AN". For example, the heat-treatment requirements on the far left side indicate that the lower electrode film 25 is subjected to a heat treatment with a temperature of 650° C., but the conductive oxide film 26 is subjected to no heat treatment. Also in FIG. 6A, the vertical axis indicates the intensity of orientation on the (100) plane when the first ferroelectric film 27 on the conductive oxide film 26 is subjected to X-ray diffraction. The study result of FIG. 6A shows the measurement data at the five portions of the first ferroelectric film 27 derived for each of the heat-treatment requirements on the lateral axis. In FIG. 6B, the vertical axis indicates the intensity of orientation on the (101) plane when the first ferroelectric film 27 on the conductive oxide film 26 is subjected to X-ray diffraction. In FIG. 6C, the vertical axis indicates the intensity of orientation on the (111) plane. In FIG. 6D, the vertical axis indicates the orientation factor of the (222) plane. In FIG. 6E, the vertical axis indicates a locking half-width of a peak on the (111) plane of the PZT film configuring the first ferroelectric film 27. Note here that, in FIGS. 6A to 6F, W/O denotes no application of heat control.

For comparison, the heat treatment is checked for the atmosphere, i.e., Ar with the 100% flow rate, $O_2$ with 1% flow rate, $O_2$ with 20% flow rate, and $O_2$ with 100% flow rate. Such a check of heat-treatment atmosphere is performed at five portions (maximum) of the silicon substrate 1 with a notch thereof located on the underside, i.e., "Top" being the upper side of the silicon substrate 1, "Left" on the left side thereof, "Center" at the center thereof, "Right1" being the area thereof away from the center toward the right by 10 mm, and "Right2" on the right side thereof, and check the crystallinity at each portion.

When the heat treatment is performed with the requirements of "Ir-AN" indicated on the lateral axis of FIGS. 6A, 6B, and 6D, and when the heat treatment is not performed with the requirements of "$IrO_x$-AN" indicated also thereon, i.e., when the lower electrode film 25 is subjected to the heat treatment but not the conductive oxide film 26, the PZT film shows the high intensity of orientation on the (100) plane and the (101) plane, but the orientation factor of the (222) plane is low. Moreover, as illustrated in FIG. 6C, the intensity of orientation on the (111) plane with such heat-treatment requirements is equivalent to that with any other heat-treatment requirements. Similarly, as illustrated in FIG. 6E, a locking half-width is equivalent to that with any other heat-treatment requirements.

On the other hand, as illustrated in FIGS. 6A, 6B, and 6D, when the $IrO_x$ film is subjected to a heat treatment with 100% Ar in "$IrO_x$-AN" on the lateral axis, i.e., in an atmosphere of Ar with 100% flow rate, the (100) and (101) planes both show the high intensity of orientation, but the orientation factor of the (222) plane is low. This is because, although the conductive oxide film 26 is crystallized, an oxygen deficit of the conductive oxide film 26 is too much therein, whereby abnormal oxidation occurs again during the temperature increase in the chamber of the MOCVD device.

Considered next is the influence of, over the crystallinity, the ratio of oxygen in the atmosphere for a heat treatment to the conductive oxide film 26. In FIGS. 6A, 6B, and 6D, with a higher ratio of oxygen, the intensity of orientation is reduced on the (100) and (101) planes, but the orientation factor of the (222) plane is increased. This is because, if the ratio of oxygen becomes too high, the conductive oxide film 26 becomes very likely to be susceptible to abnormal oxidation during the heat treatment, and such a tendency will be more apparent with a higher ratio of oxygen.

Figure 6F:
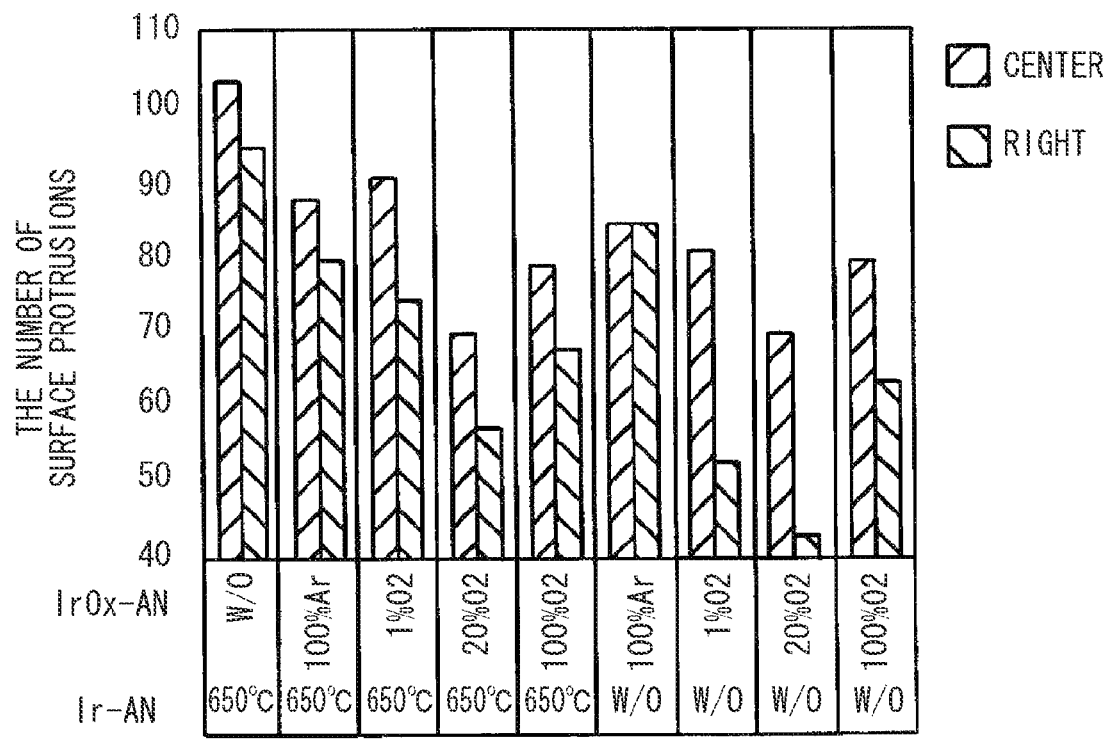
FIG. 6F is a graph illustrating the change of the number of protrusions on the surface of the PZT film by the heat-treatment requirements for the lower electrode film and the conductive oxide film.

Herein, to see whether such abnormal oxidation is occurring or not, the first ferroelectric film 27 is checked to measure the number of uneven spots on the surface thereof. FIG. 6F illustrates the result of measuring the number of surface protrusions on the first ferroelectric film 27 formed on the conductive oxide film 26. Such a measurement is performed to the area of 2.7×2.7 µm² of the substrate, and the conductive oxide film 26 here is the one after a heat treatment with various types of requirements. With a heat treatment to the lower electrode film 25, the silicon substrate 1 including the conductive oxide film 26 after a heat treatment with the 20% flow rate of oxygen ratio shows the least number of surface protrusions.

With no heat treatment to the lower electrode film 25 but with a heat treatment after the conductive oxide film 26 is formed, as illustrated in FIGS. 6A and 6B, the intensity of orientation is reduced on the (100) and (101) planes, and as illustrated in FIG. 6D, the orientation factor is increased on (222) plane. Moreover, as illustrated in FIG. 6F, the silicon substrate 1 after a heat treatment with 20% flow rate of oxygen ratio shows the most satisfactory crystallinity. Also as illustrated in FIG. 6E, the first ferroelectric film 27 shows the small number of protrusions on the surface thereof.

Figure 7A:
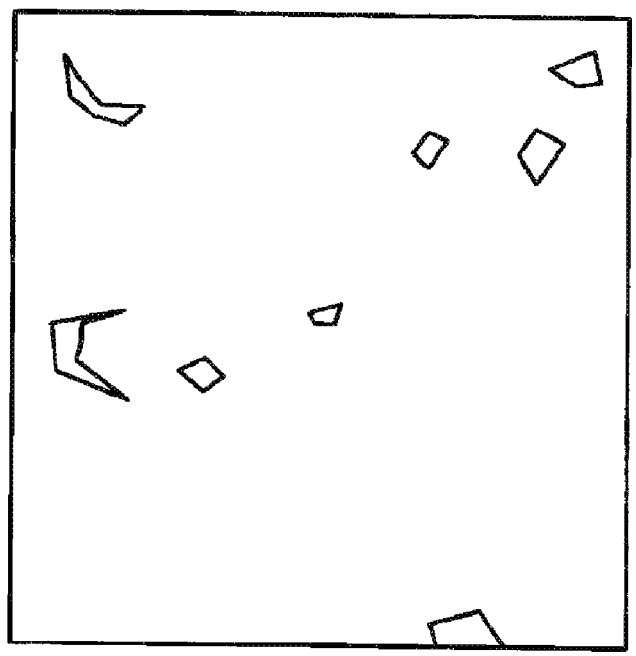
FIG. 7A is a diagram illustrating an SEM (Scanning Electron Microscope) image on the surface of the PZT film formed in the first embodiment.
Figure 7B:
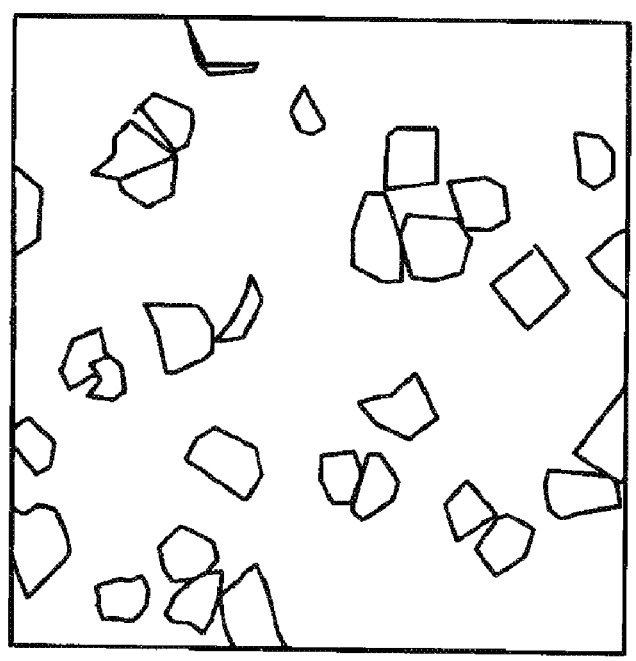
FIG. 7B is a diagram illustrating an SEM image on the surface of the PZT film formed by a reference method as a comparative example of the first embodiment.

FIG. 7A illustrates, based on an SEM image, the surface state of the first ferroelectric film 27 when the lower electrode film 25 is subjected to a heat treatment, and when the $IrO_x$-made conductive oxide film 26 is subjected to a heat treatment in an Ar atmosphere containing oxygen gas of 20% flow rate. As a comparative example, FIG. 7B illustrates, based on an SEM image, the surface state of a PZT film manufactured by the reference method. Herein, with the reference method, the first ferroelectric film is formed on the conductive oxide film 26 with no heat treatment to the $IrO_x$-made conductive oxide film. The PZT film formed by such a reference method is observed with a large number of surface uneven spots, but the first ferroelectric film 27 formed by the manufacturing method of this embodiment is observed with a drastically small number of surface uneven spots.

Figure 8:
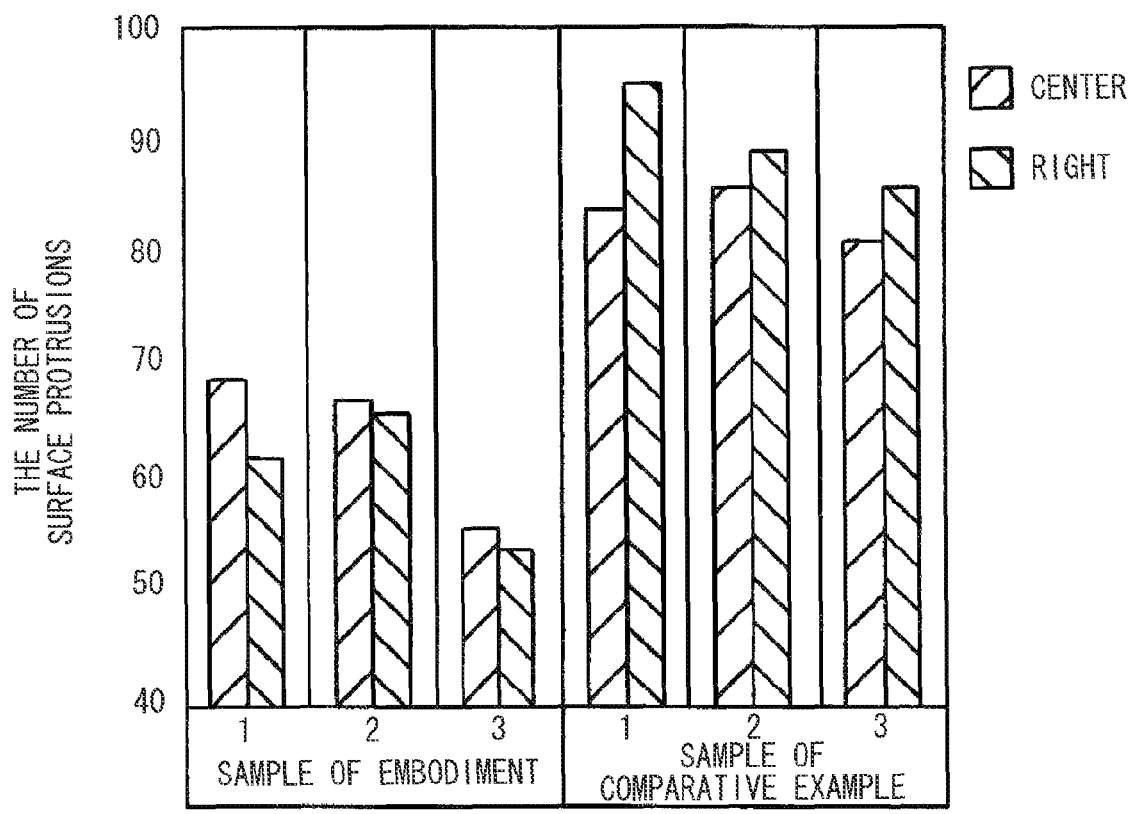
FIG. 8 is a graph illustrating the number of protrusions on the surface of the PZT film measured by performing the method of the first embodiment and the reference method each for a plurality of times.

For checking the reproducibility, a comparison is made between the reference method and the method of the embodiment by performing each for a plurality of times, and the results are the same as those described above. That is, three pieces of samples are formed each by the method of this embodiment and by the reference method, and are checked to see how many surface protrusions are observed in the area of 2.7×2.7 µm². FIG. 8 illustrates the result of such a comparison. With the result of the method of this embodiment, compared with the result of the reference method, the number of surface protrusions on the PZT film is reduced, and the surface morphology of the first ferroelectric film 27 is confirmed to be better.

Figure 9A:
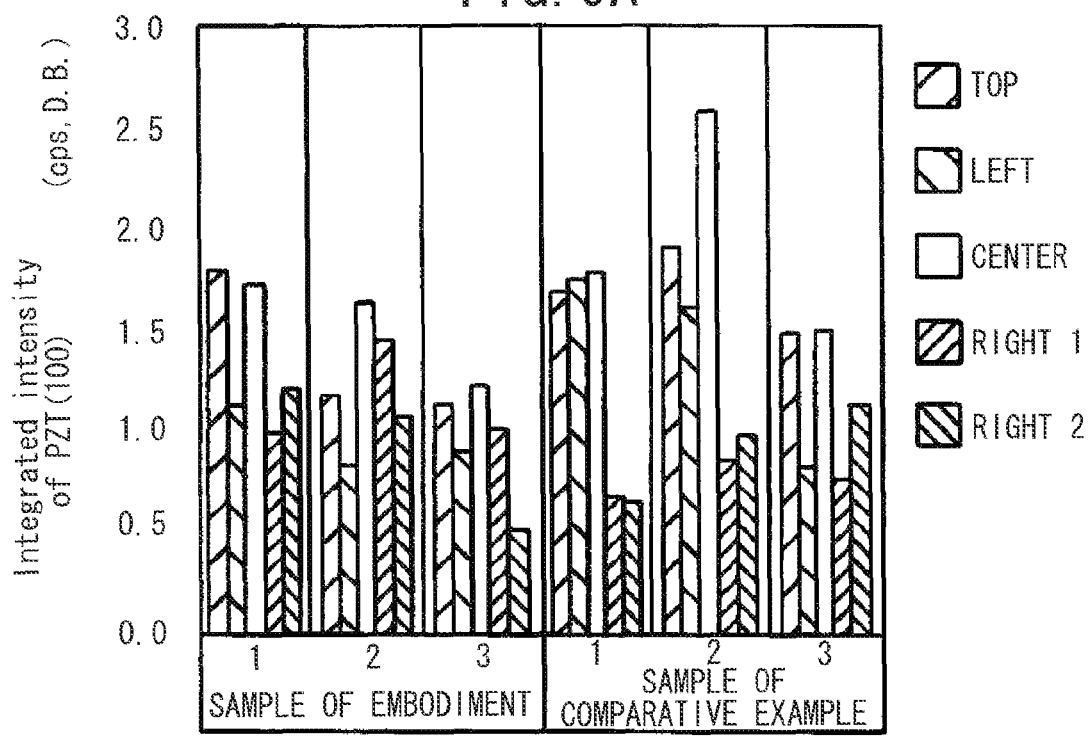
FIG. 9A is a graph for a comparison of crystal orientation angles of the PZT film by performing the method of the first embodiment and the reference method each for a plurality of times.
Figure 9B:
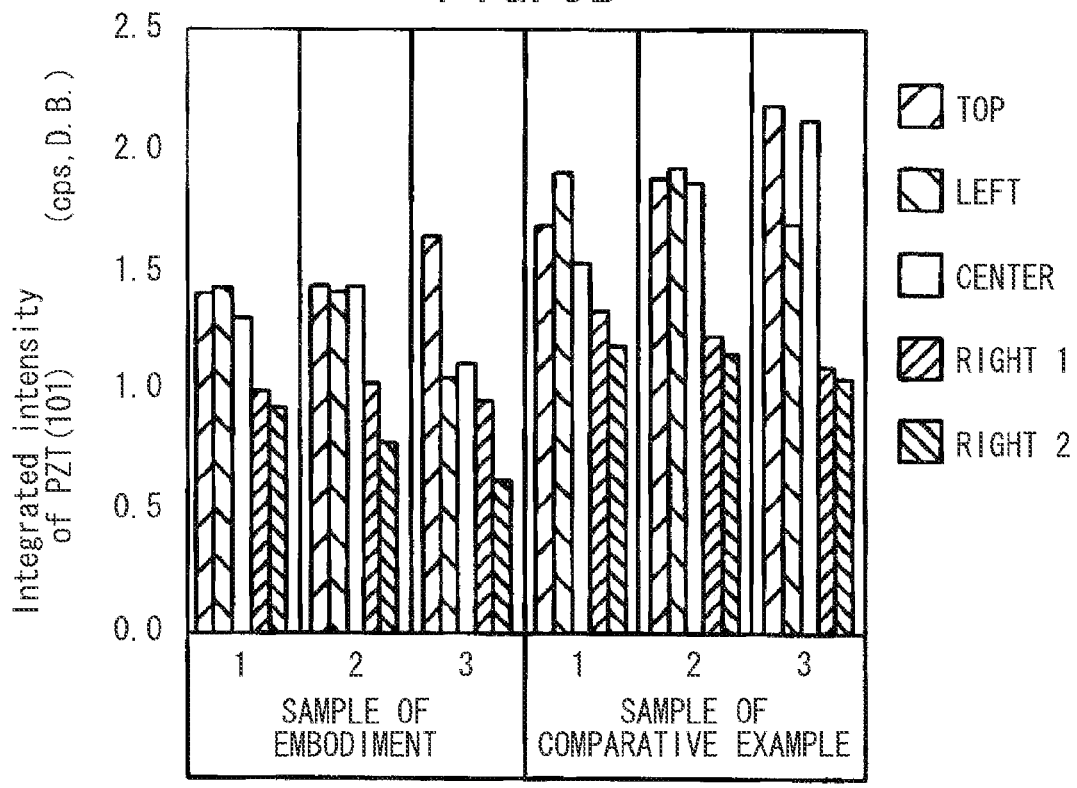
FIG. 9B is another graph for a comparison of crystal orientation angles of the PZT film by performing the method of the first embodiment and the reference method each for a plurality of times.
Figure 9C:
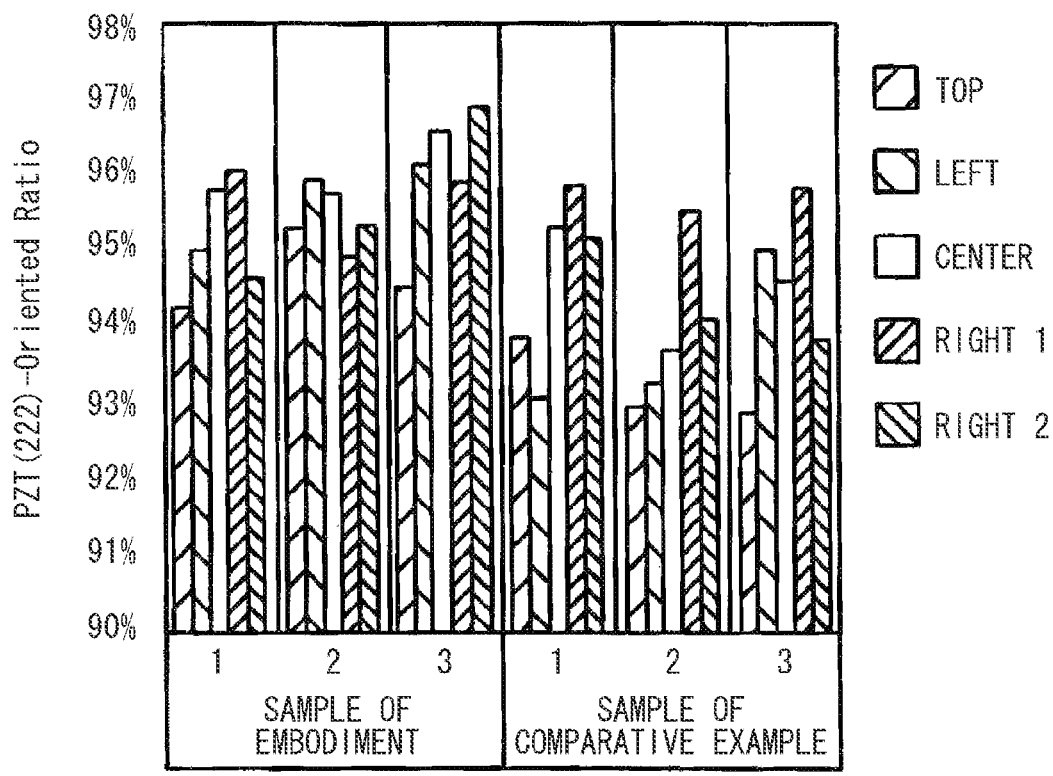
FIG. 9C is a graph for a comparison of orientation factors of the (222) plane of the PZT film by performing the method of the first embodiment and the reference method each for a plurality of times.

Such samples are then checked to see the crystal orientation angle of the PZT film. As illustrated in FIGS. 9A, 9B, and 9C, the intensity of orientation is reduced on the (100) and (101) planes but is increased on the (222) plane.

Figure 1I:
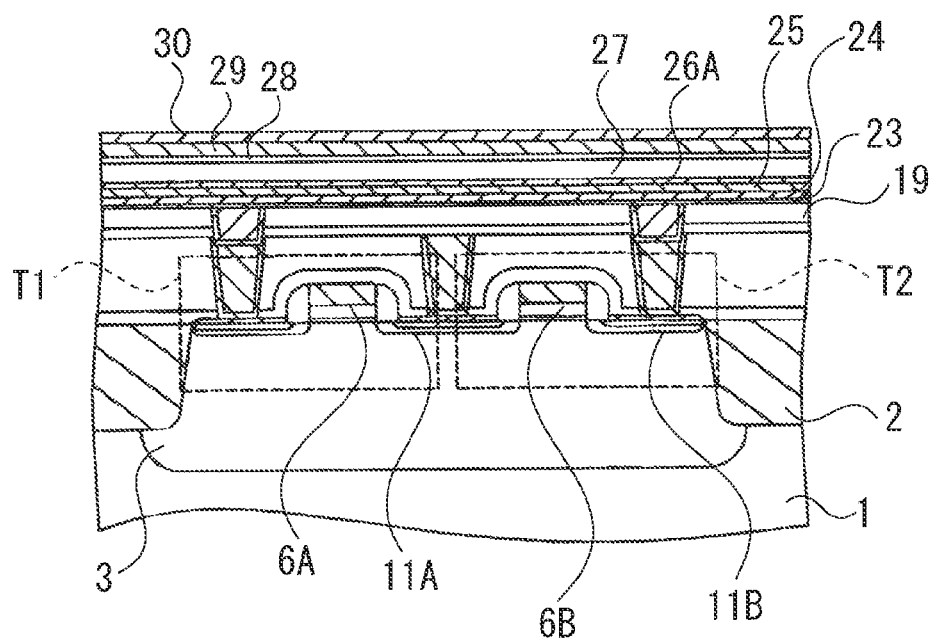
Figure 1J:
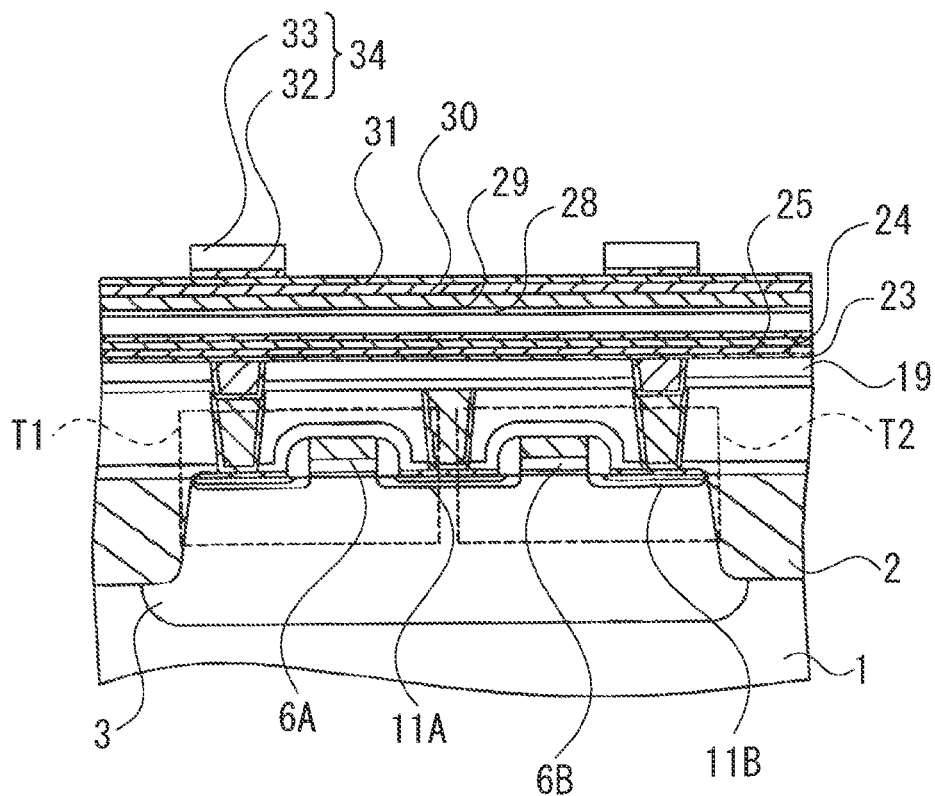

Described next is a step procedure for deriving the cross-sectional configuration of FIG. 1I.

The first ferroelectric film 27 is formed with, on the entire surface thereof, an amorphous second ferroelectric film 28 by sputtering, for example. The second ferroelectric film 28 is formed with a film thickness of between 1 nm and 30 nm, for example, and more preferably 20 nm.

The second ferroelectric film 28 is then formed thereon with a first upper electrode film 29 for use as a third conductive film. For forming the first upper electrode film 29, first of all, the second ferroelectric film 28 is formed thereon with a crystalline $IrO_x$ film by sputtering to have a thickness of 25 nm. For example, the film-forming temperature at this time is 300° C., and the film-forming gas is Ar gas and $O_2$ gas each with the flow rate of 100 sccm. The sputtering power is about 1 to 2 kW. Thereafter, the resulting film is subjected to a heat treatment at 725° C. by RTA for 60 seconds in an atmosphere containing oxygen gas of 20 sccm, and Ar gas of 2000 sccm. With such a heat treatment, the second ferroelectric film 28 is completely crystallized, and the first upper electrode film 29 is recovered from the plasma damage, thereby compensating the oxygen deficit in the first ferroelectric film 27.

For use as a second upper electrode film 30 with a film thickness of between 50 nm and 150 nm, an $IrO_Y$ film is formed. The $IrO_Y$ film is formed by deposition for 45 seconds in an Ar atmosphere with the pressure of 0.8 Pa and with the sputtering power of 1.0 kW, and the resulting film will have a thickness of 125 nm. For preventing the $IrO_Y$ film from being abnormally grown, the film-forming temperature is preferably 100° C. or lower. If an iridium oxide film is formed with the composition close to the stoichiometry of $IrO_2$ for suppressing any possible production deterioration, no catalysis occurs against hydrogen, thereby reducing the problem of the second ferroelectric film 28 being reduced by hydrogen radicals. Accordingly, the capacitor is improved in terms of resistance to hydrogen.

Herein, the second upper electrode 30 is surely not restrictively made of $IrO_2$, but any other materials such as Ir, Ru, Rh, Re, Os, Pd, and oxide thereof, or the conductive oxide such as $SrRuO_3$ will also do, or a lamination structure thereof is also a possibility.

Described next is a step procedure for deriving the cross-sectional configuration of FIG. 1.

First of all, an Ir film is deposited on the second upper electrode film 30 for use as a hydrogen barrier film 31 by sputtering. Such film deposition is performed until the film has a thickness of between 50 nm and 100 nm in an Ar atmosphere with the pressure of 1 Pa and the sputtering power of 1.0 kW. Herein, the hydrogen barrier film 31 also serves as a conductivity-increasing film. The material therefor is surely not restrictive to Ir, and any film selected from a group of films, i.e., Ru, Rh, and Pd, will also do.

The rear surface of the silicon substrate 1 is washed, and first and second mask material layers 32 and 33 are formed in sequence for use each as a mask at the time of patterning of the films, i.e., the first and second upper electrode films 29 and 30, the first and second ferroelectric films 27 and 28, the first and second lower electrode films 25 and 26A, and others.

The first mask material layer 32 is formed on the hydrogen barrier film 31, and is made of TiN by sputtering. Alternatively, the first mask material layer 32 may be made of TiAlN, TaAlN, and TaN, or a laminated film thereof.

The second mask material layer 33 is formed on the first mask material layer 32, and is a silicon oxide film formed by CVD using TEOS gas, for example.

Thereafter, the second mask material layer 33 is coated thereon with photoresist (not illustrated), and the photoresist is then exposed to light and then developed, thereby forming a resist pattern in the shape of capacitor in plan view.

At the time of etching, first of all, the resist pattern is used as a mask to perform patterning to the second mask material layer 33 in an island shape, and then the first mask material layer 32 is subjected to etching using the second mask material layer 33 as a mask. As a result, a hard mask 34 configured by the first and second mask material layers 32 and 33 is formed in an island shape in the capacitor-formed area.

Figure 1K:
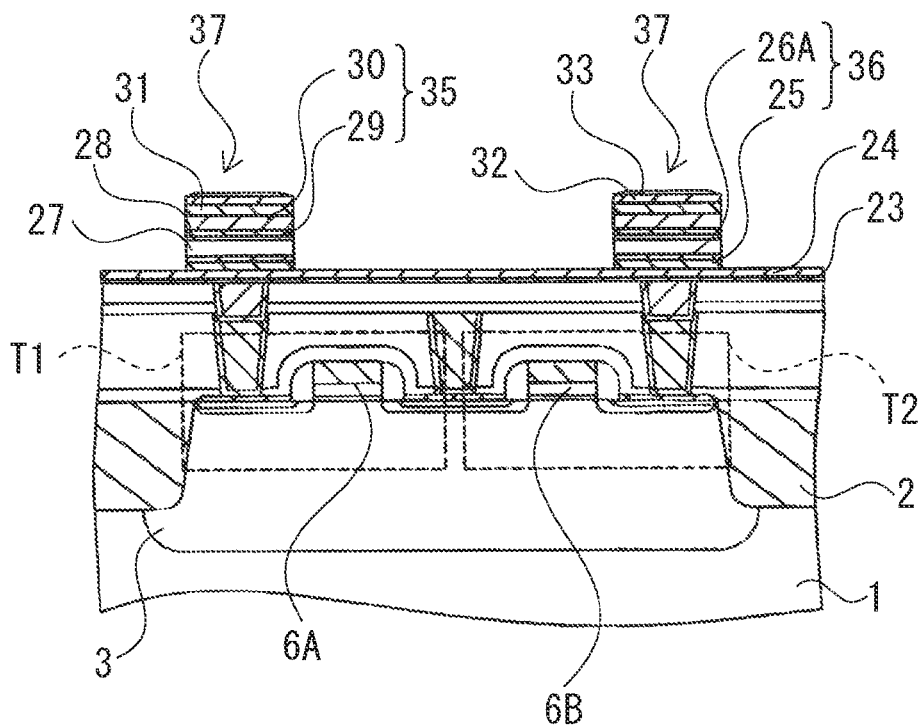

Described next is a step procedure for deriving the cross-sectional configuration of FIG. 1K.

Plasma etching is performed using mixed gas containing HBr, $O_2$, Ar, and $C_4F_8$ as etching gas, and any portion of the films not covered by the hard mask 34, i.e., the first and second upper electrode films 29 and 30, the first and second ferroelectric films 27 and 28, the second conductive film 26A, and the lower electrode film 25, is subjected to dry etching. As a result, the upper electrode films 29 and 30 are through with patterning so that an upper electrode film 35 is formed for use by a capacitor. Similarly, the second conductive film 26A and the lower electrode film 25 are through with patterning so that a lower electrode 36 is formed for use by a capacitor. Thereafter, a ferroelectric capacitor 37 is formed with an upper electrode 80, the ferroelectric films 27 and 28, and a lower electrode 73. After the completion of the patterning, the second mask material layer 33 is removed by dry or wet etching.

Figure 1L:
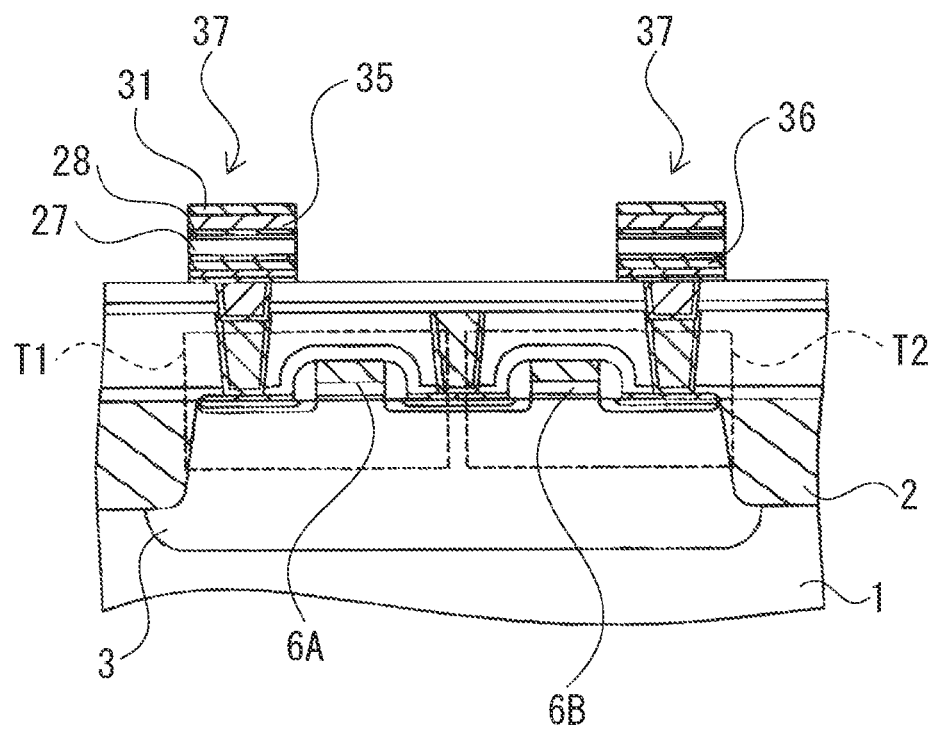

Next, as illustrated in FIG. 1L, any portion of the films not covered by the ferroelectric capacitor 37, i.e., the oxidation diffusion barrier film 24, the base conductive film 23, and the first mask material layer 32, is removed by dry etching, and the oxidation diffusion barrier film 24 and the base conductive film 23 are each left in an island shape only below the ferroelectric capacitor 37.

Figure 1M:
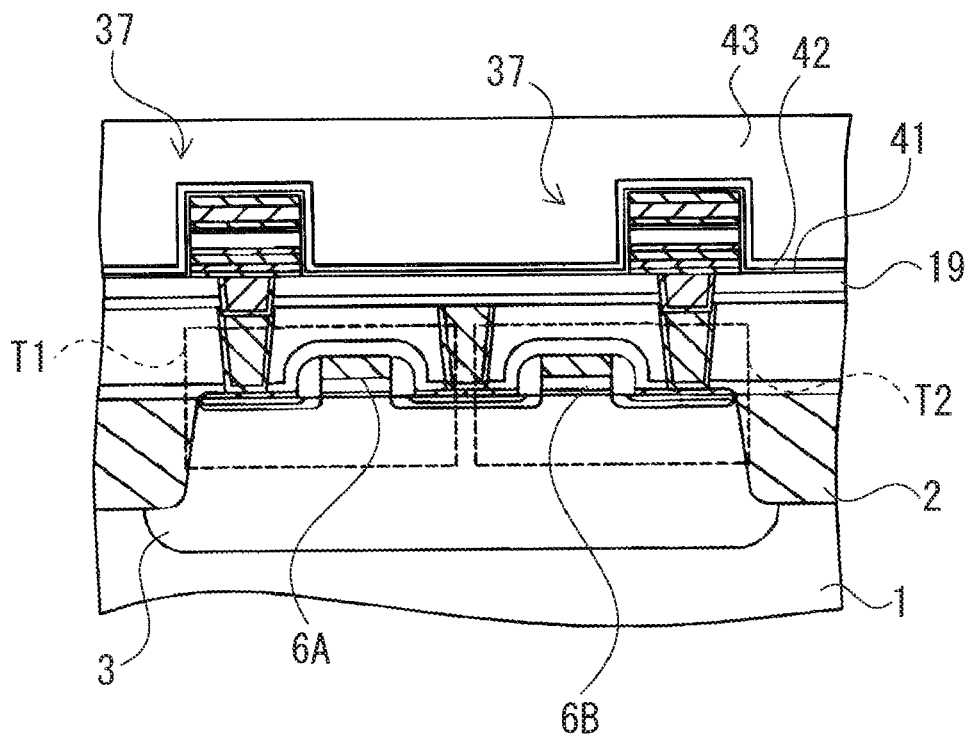

Described next is a step procedure for deriving the cross-sectional configuration of FIG. 1M.

For use as a first protection film 41 covering the ferroelectric capacitor 37 and the second interlayer insulating film 19, an $Al_2O_3$ film is formed with a film thickness of 20 nm by sputtering. Alternatively, for use as the first protection film 41, an $Al_2O_3$ film is formed with a thickness of between 2 nm and 5 nm by MOCVD or ALD (Atomic Layer Deposition).

Herein, for damage recovery of the ferroelectric films 27 and 28, recovery annealing is performed in an atmosphere containing oxygen gas. The requirements for such recovery annealing are not specifically restricted, but may include the substrate temperature of between 550° C. and 700° C. in a furnace, for example. When the ferroelectric films 27 and 28 are each a PZT film, annealing is preferably performed in an atmosphere of oxygen at the temperature of 600° C. for 60 minutes.

Next, for use as a second protection film 42 for covering the first protection film 41, an $Al_2O_3$ film is formed by CVD with a film thickness of about 38 nm.

The $Al_2O_3$ film configuring the second protection film 42 has an excellent capability of preventing any reducing substance such as hydrogen and moisture from going therethrough. This accordingly protects the ferroelectric characteristics of the ferroelectric films 27 and 28 from any possible deterioration to be caused by the reducing substance as such.

Thereafter, the second protection film 42 is formed with, on the entire surface thereof, a silicon oxide film for use as a third interlayer insulating film 43. Such a silicon oxide film is formed with a film thickness of 1500 nm by plasma CVD, for example. When a silicon oxide film is formed for use as the third interlayer insulating film 43 as such, raw material gas for use is mixed gas of TEOS gas, oxygen gas, and helium gas. Alternatively, the third interlayer insulating film 43 may be an insulating film formed using inorganic gas, for example. After the third interlayer insulating film 43 is formed as such, the surface thereof is made flat by CMP, for example.

A heat treatment is then performed in a plasma atmosphere generated using $N_2O$ gas or $N_2$ gas, for example, any moisture in the third interlayer insulating film 43 is removed. At this time, the third interlayer insulating film 43 is reformed in terms of film quality, and thus moisture finds it difficult to get into the film.

Figure 1N:
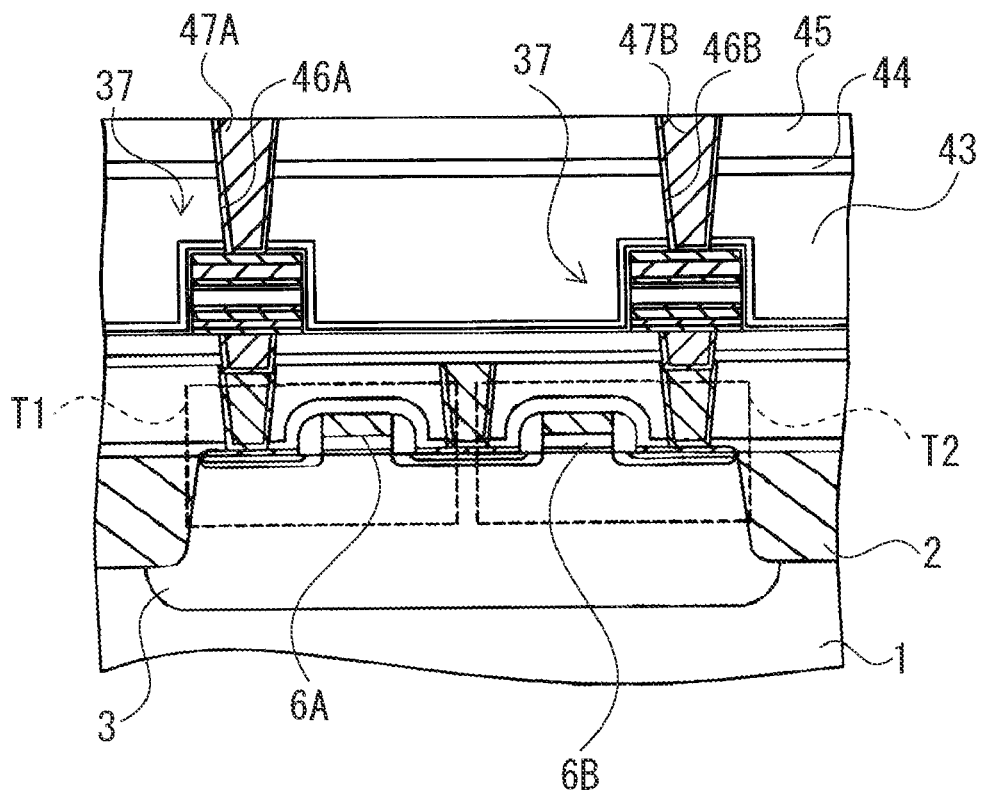

Described next is a step procedure for deriving the cross-sectional configuration of FIG. 1N.

First of all, the third interlayer insulating film 43 is formed with, on the entire surface thereof, a third protection film 44 for use as a barrier film by sputtering or CVD, for example. The third protection film 44 is exemplified by an $Al_2O_3$ film with a film thickness of 20 nm to 100 nm. Such a third protection film 44 is formed on the third interlayer insulating film 43 having been made flat, and thus the third protection film 44 is also made flat on the surface.

Thereafter, the third protection film 44 is formed with, on the entire surface thereof, a fourth interlayer insulating film 45 by plasma CVD using TEOS gas, for example. The fourth interlayer insulating film 45 is exemplified by a silicon oxide film with a film thickness of between 300 nm and 500 nm, for example. Alternatively, the fourth interlayer insulating film 45 may be a SiON film or a silicon nitride film, for example. After the fourth interlayer insulating film 45 is formed as such, the surface thereof is made flat by CMP, for example.

Thereafter, using a resist mask, via holes 46A and 46B are formed in the fourth interlayer insulating film 45. For forming the via holes 46A and 46B, the hydrogen barrier film 31 covering the upper electrode 80 of a capacitor 81 is exposed, and then the structure is subjected to a heat treatment in an oxygen atmosphere at 550° C. This accordingly recovers an oxygen deficit occurred in the first ferroelectric film 27 at the time of formation of the via holes 46A and 46B. Thereafter, conductive plugs 47A and 47B are formed for electrical connection to the upper electrode film 35 of the ferroelectric capacitor 37 via the via holes 46A and 46B, respectively.

Figure 1O:
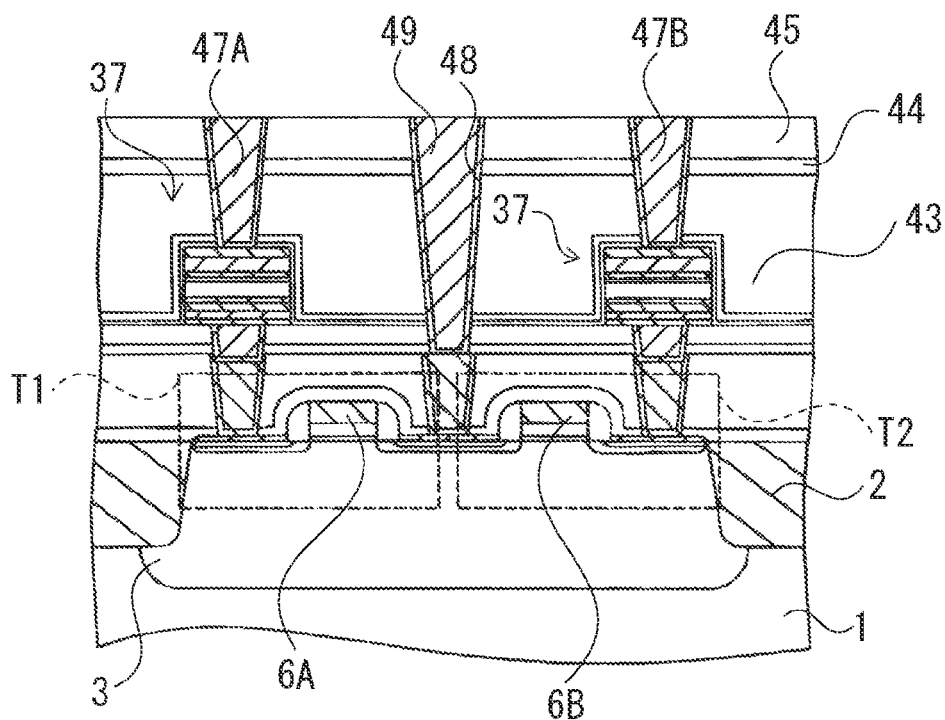

Described next is a step procedure for deriving the cross-sectional configuration of FIG. 1O.

A via hole 48 is formed on the conductive plug 16B at the center of the p well 3. For forming a conductive plug 49 to the via hole 48, it is preferably to solely form a TiN film on the surface of the via hole 48 as a contact film. Alternatively, the contact layer may be formed first by forming a Ti film by sputtering, and then by forming a TiN film thereover by MOCVD. If this is the case, a treatment is required to be performed in mixed gas plasma of nitrogen and hydrogen for removing any carbon from the TiN film. However, in this embodiment, because the hydrogen barrier film 31 made of Ir is formed on the upper electrode film 35, no reduction treatment will be performed to the upper electrode film 35.

Figure 1P:
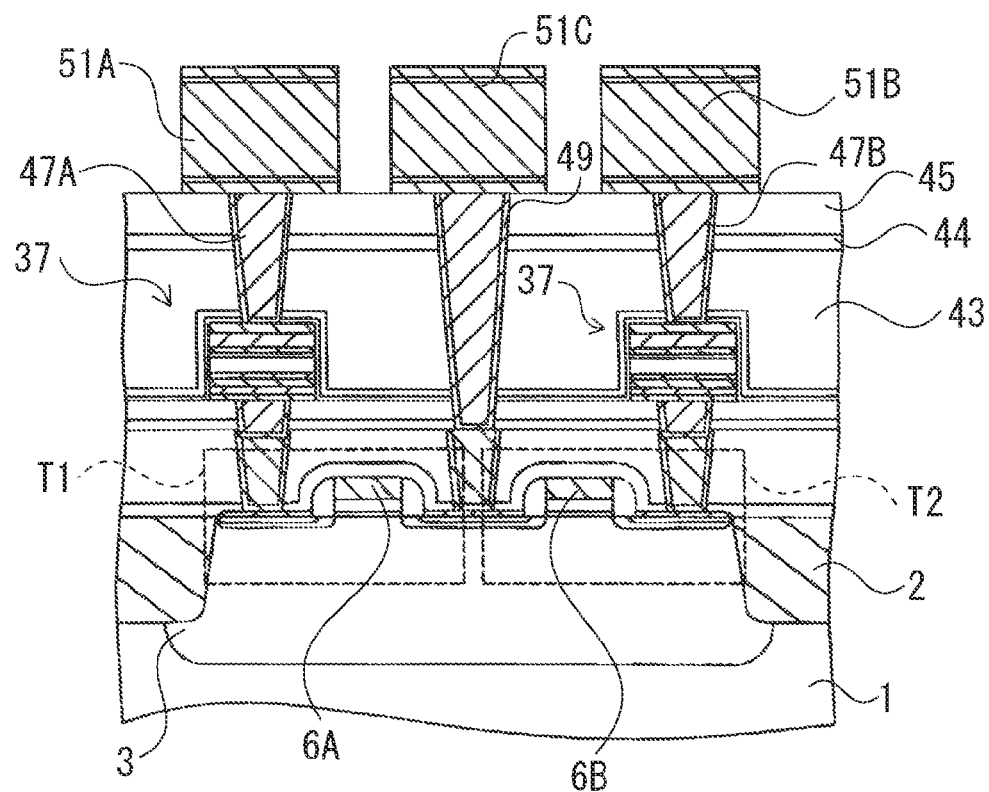

Described next is a step procedure for deriving the cross-sectional configuration of FIG. 1P.

On the fourth interlayer insulating film 45, a wiring pattern is formed corresponding to the conductive plugs 47A, 47B, and 49. That is, various films are formed in sequence by sputtering, e.g., a 60-nm-thickness Ti film, a 30-nm-thickness TiN film, a 360-nm-thickness AlCu alloy film, a 5-nm-thickness Ti film, and 70-nm-thickness TiN film. This accordingly forms a laminated film including the Ti film, the TiN film, the AlCu alloy film, the Ti film, and the TiN film.

Using the photolithography technology, the laminated film is then subjected to patterning. With such patterning, wiring patterns (first metal wiring layers) 51A, 51B, and 51C each being a laminated film are formed. As a result, the upper electrode film 35 on the ferroelectric capacitor 37 is electrically connected to the wiring patterns 51A and 51B via the conductive plugs 47A and 47B. Similarly, the source/drain area 11A and the wiring pattern 51C are electrically connected together via the conductive plugs 16C and 49.

Thereafter, although not illustrated, after the formation of the interlayer insulating film, the procedure goes to a process of forming the conductive plug and wiring pattern for the second to fifth layers and others. After such a process, if a TEOS oxide film and a SiN-made cover film are formed, for example, a ferroelectric memory may be completed with a ferroelectric capacitor.

As described above, in this embodiment, the conductive oxide film 26 being an amorphous or microcrystalline metal oxide film is formed, and after the conductive oxide film 26 is subjected to annealing, the conductive oxide film 26 is subjected to a reduction treatment to reform it into the second conductive film 26A. After such a process, the first ferroelectric film 27 is formed by MOCVD. As such, the crystal particles in the conductive oxide film 26 are first made uniform by annealing, and then the resulting film is subjected to a reduction treatment so that a metal film is formed. In this manner, the resulting second conductive film 26A may have the crystal particles small in size. As such, the first ferroelectric film 27 is formed on the second conductive film 26A having the small crystal particles, thereby improving the morphology of the PZT film configuring the first ferroelectric film 27. With the ferroelectric capacitor 37 configured as such, the crystallinity may be increased in the capacitor configuration, i.e., the lower electrode 36 and the ferroelectric films 27 and 28. With the crystallinity increased as such, the ferroelectric films 27 and 28 may have the better in-plane distribution, and thus the morphology may be improved, thereby preventing any possible production deterioration. Accordingly, the amount of inversion charge becomes high so that the resulting capacitor configuration may be highly reliable. What is better, the leak current is reduced so that the resulting semiconductor device may be also highly reliable.

Specifically when the conductive oxide film 26 is formed with a film-forming temperature of between 10° C. and 100° C., more preferably between 25° C. and 50° C., an amorphous or microcrystalline $IrO_x$ film may be formed without fail. Moreover, when the conductive oxide film 26 formed as such is subjected to a heat treatment with the pressure in a range of 1 Pa to a value of atmospheric pressure in an Ar atmosphere containing oxygen gas of 20% flow rate, the resulting metal film may have the small and uniform crystal particles, and the PZT film to be formed thereon may have any predetermined orientation with better morphology.

The issue here is that, in the previous technologies, a ferroelectric film has been formed by MOCVD at a high temperature of 600° C. or higher, and there have been the following problems. That is, the crystallinity of the PZT film is very unstable, and thus the morphology becomes also very non-uniform, i.e., the surface gets uneven. As a result, the film in the vicinity of the substrate often gets whitish. This is because the lower electrode film is susceptible to abnormal oxidation during temperature increase. The $IrO_x$ film formed as a result of such abnormal oxidation is subjected to a reduction treatment when the ferroelectric film is formed using a solvent for MOCVD, i.e., THF (TetraHydroFuran: $C_4H_8O$) solution, or butyl acetate. At the time of the reduction treatment as such, the film will be easily out of phase. As a result, the ferroelectric film to be deposited thereon suffers from poor crystallinity. On the other hand, with the semiconductor device manufacturing method of the embodiment, such problems may be favorably solved so that the resulting semiconductor device may be highly reliable.

Second Embodiment

Figure 10:
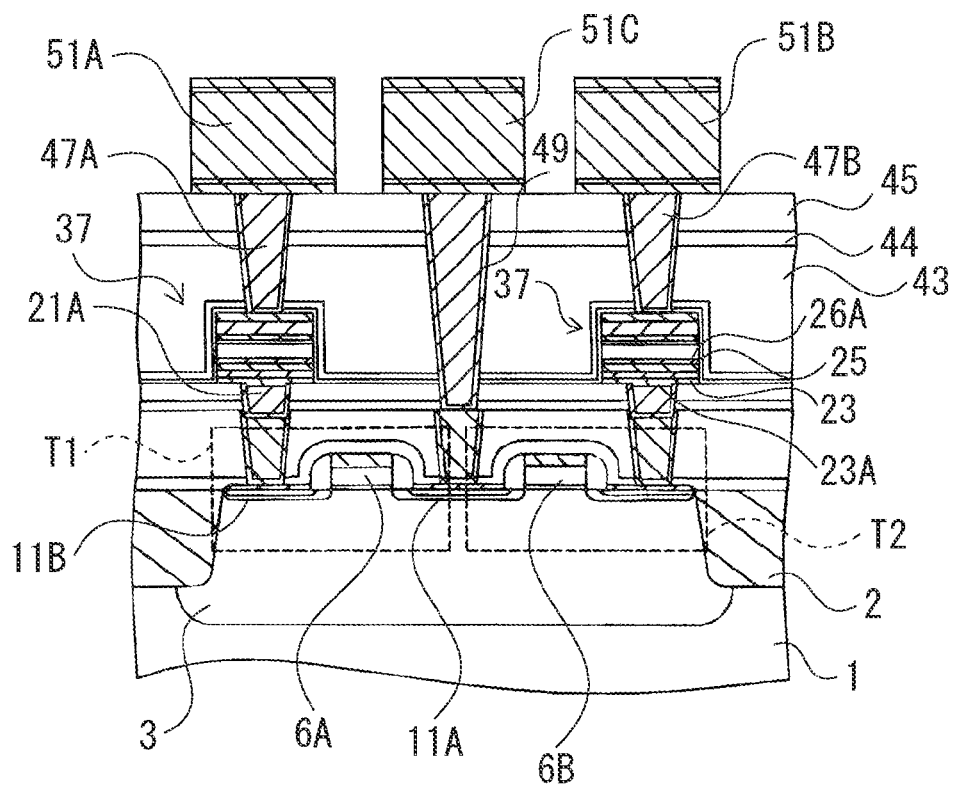
FIG. 10 is a cross sectional view of a semiconductor device of a second embodiment, illustrating manufacturing steps therefor.

A second embodiment of the invention is described in detail by referring to FIG. 10. Any component same as that in the first embodiment is provided with the same reference numeral, and it is not described twice if it is already described.

A semiconductor device of the embodiment is a semiconductor memory device of a stack configuration, i.e., ferroelectric memory. When the conductive plugs 21A and 21B are formed using a via hole, it is difficult to make completely flat all the surfaces of the conductive plugs 21A and 21B, and the second interlayer insulating film 19 therearound. Generally, the upper surfaces of the conductive plugs 21A and 21B are located higher than the upper surface of the second interlayer insulating film 19, and thus a recess is formed above the portion of the second interlayer insulating film 19 on the conductive plugs 21A and 21B. This recess has a depth of between 20 nm and 50 nm, and typically, about 50 nm. This recess affects the orientation of the lower electrode and that of the ferroelectric film.

In consideration thereof, in this embodiment, the second interlayer insulating film 19 on the silicon substrate 1 is subjected to an ammonia ($NH_3$) plasma treatment on the surface, and an NH group is coupled to atoms of oxygen on the surface of the second interlayer insulating film 19. This accordingly prevents, even if atoms of Ti are deposited more on the second interlayer insulating film 19, the atoms of Ti from being captured by the atoms of oxygen. As a result, the atoms of Ti become able to freely move on the surface of the second interlayer insulating film 19. As a result, the Ti film formed on the second interlayer insulating film 19 is allowed to show any predetermined crystal orientation, e.g., allowed to achieve the (002) orientation by itself.

Note here that the ammonia plasma treatment is performed using a parallel-plate type plasma treatment device in which an opposing electrode is disposed at a position away from the silicon substrate 1 by about 9 mm (350 mils). The requirements for the treatment are to provide an ammonia gas with a flow rate of 350 sccm into a container kept at the substrate temperature of 400° C. in the pressure of 266 Pa (2 Torr). Such requirements are also to provide, for 60 seconds, high frequencies of 13.56 MHz with the power of 100 W to the side of the silicon substrate 1, and to provide high frequencies of 350 kHz with the power of 55 W to the opposing electrode.

Then in a sputtering device in which the distance between the silicon substrate 1 and a target is set to 60 mm, in an Ar atmosphere of 0.15 Pa, a supply of 2.6-kW sputtering DC power is made for 35 seconds at a substrate temperature of 20° C. With such a power supply, a Ti film with the intense (002) orientation is formed with a thickness of about 100 nm.

Thereafter, the Ti film is subjected to a heat treatment (RTA) in a nitride atmosphere at a substrate temperature of 650° C. for 60 seconds, thereby deriving the conductive base film 23A being a TiN film with the (111) orientation. The base film 23A preferably has a thickness of between 100 nm and 300 nm, and is about 100 nm in this embodiment. Note here that the base film 23A is not restrictive to titanium nitride film, and any of a tungsten film, a silicon film, and a copper film will also do.

With the recess of the conductive plugs 16A and 16B, the upper surface of the base film 23A is formed with a concave section. The base film 23A is thus polished on the upper surface by CMP to be flat so that the concave section is removed. The slurry for use with CMP is not specifically restricted, but is exemplified by SSW2000 of Cabot Microelectronics Corporation. Herein, due to a deviation occurred during polishing, the base film 23A after CMP varies in thickness, e.g., the thickness in the plane of the silicon substrate 1 is different from that among a plurality of silicon substrates 1. Accordingly, if such a variation is taken into consideration to control the time for polishing, the base film 23A after CMP may have a target thickness of between 50 nm and 100 nm, more preferably 50 nm.

The concern here is that, after the base film 23A is subjected to CMP, the crystal particles in the vicinity of the upper surface of the base film 23A are distorted due to polishing. If the base film 23A whose crystal particles are distorted is formed thereon with the ferroelectric capacitor 37, such distortion affects the lower electrode 36, and the lower electrode film 25 suffers from poor crystallinity, thereby possibly degrading the characteristics of the ferroelectric films 27 and 28 on the base conductive film 23. For preventing such an inconvenience, the upper surface of the base film 23A is exposed to $NH_3$ plasma as described above, thereby correcting the distortion of the crystal particles of the base film 23A, and protecting films to be deposited later from the influence thereof.

Thereafter, the base film 23A is formed thereon with a conductive film Ti with improved crystallinity, and the resulting film is subjected to a heat treatment in a nitrogen atmosphere, thereby forming the base conductive film 23.

The process thereafter is the same as that in the first embodiment. That is, various films are formed, i.e., oxygen diffusion barrier film 24, the lower electrode film 25, and the conductive oxide film 26, and these films are subjected to rapid thermal annealing (RTA) in a mixed gas atmosphere containing oxygen gas and Ar gas. When the first ferroelectric film 27 is formed by MOCVD later, the conductive oxide film 26 is subjected to a reduction treatment so that the second conductive film 26A is formed. Moreover, after forming various other films in sequence, i.e., the second ferroelectric film 28, the upper electrode films 29 and 30, and the hydrogen barrier film 31, a hard mask is used to subject these films to patterning, thereby forming the ferroelectric capacitor 37. The ferroelectric capacitor 37 is then formed thereon with a wiring pattern.

With the manufacturing method of the second embodiment, the first ferroelectric film 27 is formed after crystallizing the amorphous or microcrystalline conductive oxide film 26 by the RTA treatment, thereby leading to the same effects as those in the first embodiment. Especially, the recess formed when the conductive plugs 16A and 16B are formed may reduce the influence over the ferroelectric capacitor 37 so that the resulting semiconductor device may be highly reliable.

Figure 11:
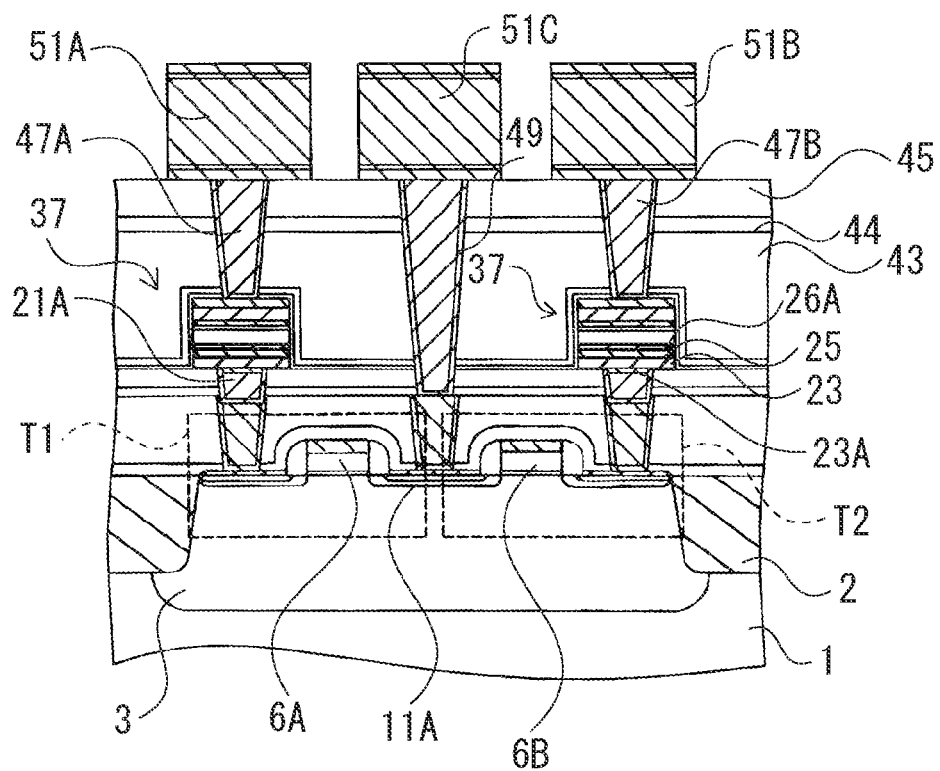
FIG. 11 is a cross sectional view of the semiconductor device of a modified example of the second embodiment, illustrating manufacturing steps therefor.

Alternatively, as illustrated in FIG. 11, after forming the base film 23A, the film may be polished by CMP to remove it from the upper surface of the second interlayer insulating film 19 but not from the conductive plugs 21A and 21B.

Figure 12:
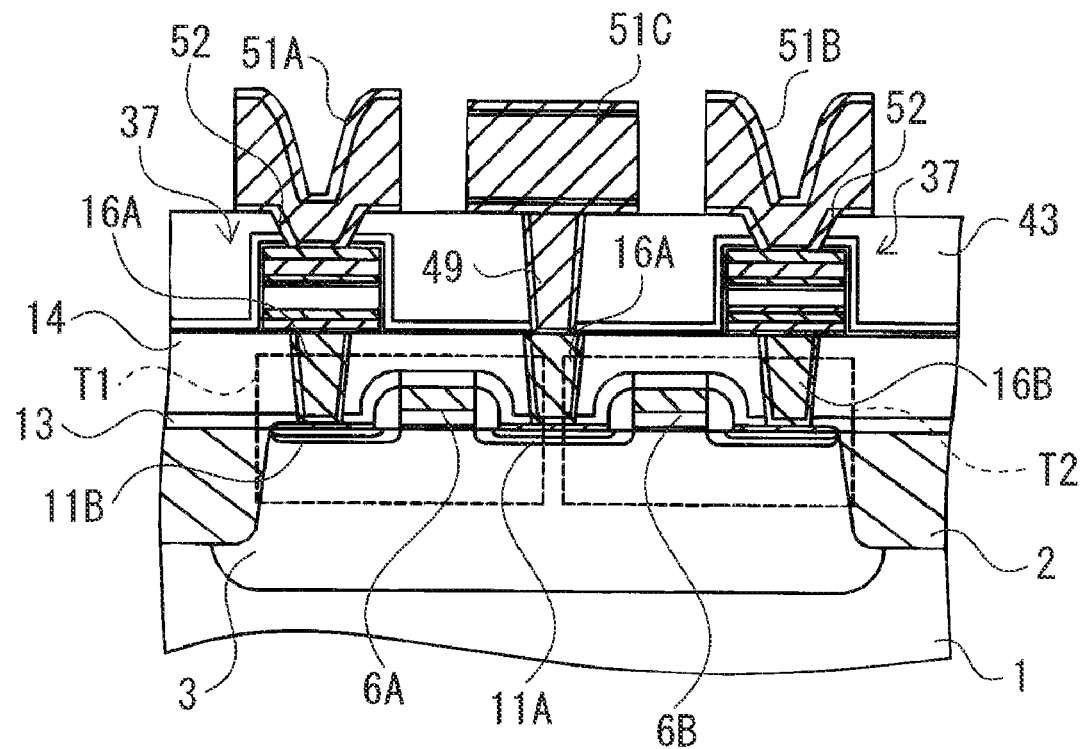
FIG. 12 is another cross sectional view of the semiconductor device of the modified example of the second embodiment, illustrating manufacturing steps therefor.

Moreover, as illustrated in FIG. 12, with the ferroelectric memory (semiconductor device) and the manufacturing method thereof in this embodiment, the process of conductive plug formation may be performed only once. That is, after forming the conductive plugs 16A and 16B to the first interlayer insulating film 14, the ferroelectric capacitor 37 is formed to establish a direct electrical connection to the conductive plugs 16A and 16B. Moreover, after forming the third interlayer insulating film 43, an aperture 52 is formed to link to the ferroelectric capacitor 37, thereby forming the wiring patterns 51A and 51B. Moreover, a contact hole is formed on the conductive plug 16A that is not connected to the ferroelectric capacitor 37, and the conductive plug 49 is formed therein.

Third Embodiment

A third embodiment of the invention is described in detail by referring to the accompanying drawings. Any component same as that in the first and second embodiments is provided with the same reference numeral, and it is not described twice if it is already described.

This embodiment is related to a semiconductor device including a capacitor of a planar configuration, and a manufacturing method thereof.

Figure 13A:
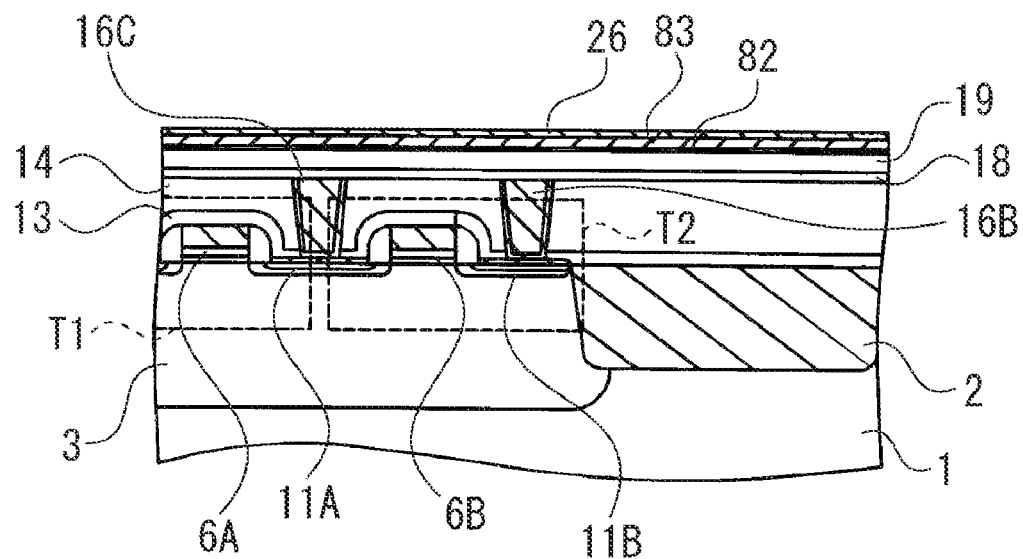
FIGS. 13A to 13H are each a cross sectional view of a semiconductor device of a third embodiment, illustrating manufacturing steps therefor.

First of all, described is a step procedure for deriving the cross-sectional configuration of FIG. 13A.

On the surface of the silicon substrate 1, the element isolation insulating film 2 is used to partition the active areas in a memory area, i.e., the p wells 3, thereby forming the transistors T1 and T2. Corresponding to the positions of the source/drain areas 11A and 11B, the conductive plugs 16A, 16B, and 16C (not illustrated) are formed to the first interlayer insulating film 14. The details of such a process are the same as those in the first embodiment.

Next, on the first interlayer insulating film 14 and the conductive plugs 16A to 16C, the first oxide barrier film 18 and the second interlayer insulating film 19 are formed. The second interlayer insulating film 19 is of a configuration that an SiON film is formed with a film thickness of about 100 nm, and a silicon oxide film is deposited with a film thickness of about 130 nm by plasma CVD using TEOS.

The second interlayer insulating film 19 is formed thereon with a lower electrode contact film 82, i.e., $Al_2O_3$ film, with a thickness of about 20 nm by sputtering. Thereafter, the lower electrode contact film 82 is subjected to oxidation in an oxygen atmosphere at 650° C. by RTA.

The lower electrode contact film 82 is formed thereon with a lower electrode film 83 (lower conductive film) being a first metal film. The lower electrode film 83 is made of an Ir film formed by sputtering, for example, and the thickness thereof is about 150 nm. The lower electrode film 83 is not surely restricted to the Ir film as such, but may be any single-layer film of Pt, Ru, $RuO_2$, and $SrRuO_3$, or a laminated film thereof will also do. Thereafter, the lower electrode film 83 is subjected to a RTA treatment. The requirements for such a heat treatment are the same as those in the first embodiment, e.g., in an Ar atmosphere with a temperature of between 650° C. and 750° C. for 60 seconds. As a result, the adhesion may be improved among the layers.

The lower electrode film 83 is formed thereon with, as the conductive oxide film 26, a precious-metal oxide film, e.g., an amorphous or uniform-microcrystalline $IrO_x$ film with a thickness of between 5 nm and 50 nm, preferably between 10 nm and 40 nm. The film-forming requirements include the pressure of 0.11 Pa, the substrate temperature of between 20° C. and 300° C., and the sputtering power of 1 kW in a mixed atmosphere containing Ar gas and oxygen gas. After the conductive oxide film 26 is formed, the film is crystallized by RTA. The requirements for RTA are the same as those in the first embodiment. By performing RTA, the resulting conductive oxide film 26 may have the crystal particles being uniform and small in size.

Figure 13B:
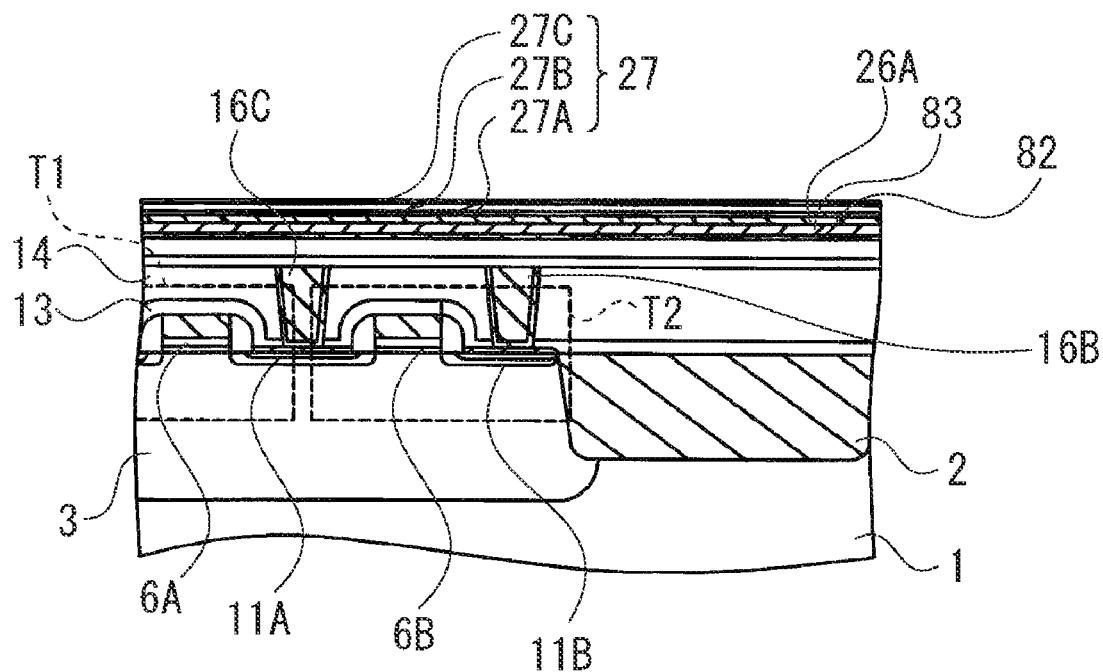

Described next is a step procedure for deriving the cross-sectional configuration of FIG. 13B.

The conductive oxide film 26 is formed thereon with the first ferroelectric film 27, i.e., PZT film, by MOCVD. In this embodiment, after first forming the initial layer 27A and the core layer 27B by MOCVD, the surface layer section 27C is formed by sputtering. The film-forming requirements are same as those in the first embodiment. At the time of formation of the initial layer 27A, the conductive oxide film 26 is subjected to a reduction treatment by a solvent component included in the raw material gas, and the resulting conductive oxide film 26 is reformed to the second conductive film 26A. The second conductive film 26A is oriented, with a priority, to the (111) plane of the Ir film in accordance with the orientation of the Ir film of the lower electrode film 83 therebelow. As a result, as to the PZT film of the first ferroelectric film 27, the (111) plane is oriented with a priority in accordance with the crystal orientation of the second conductive film 26A being the base layer.

Figure 13C:
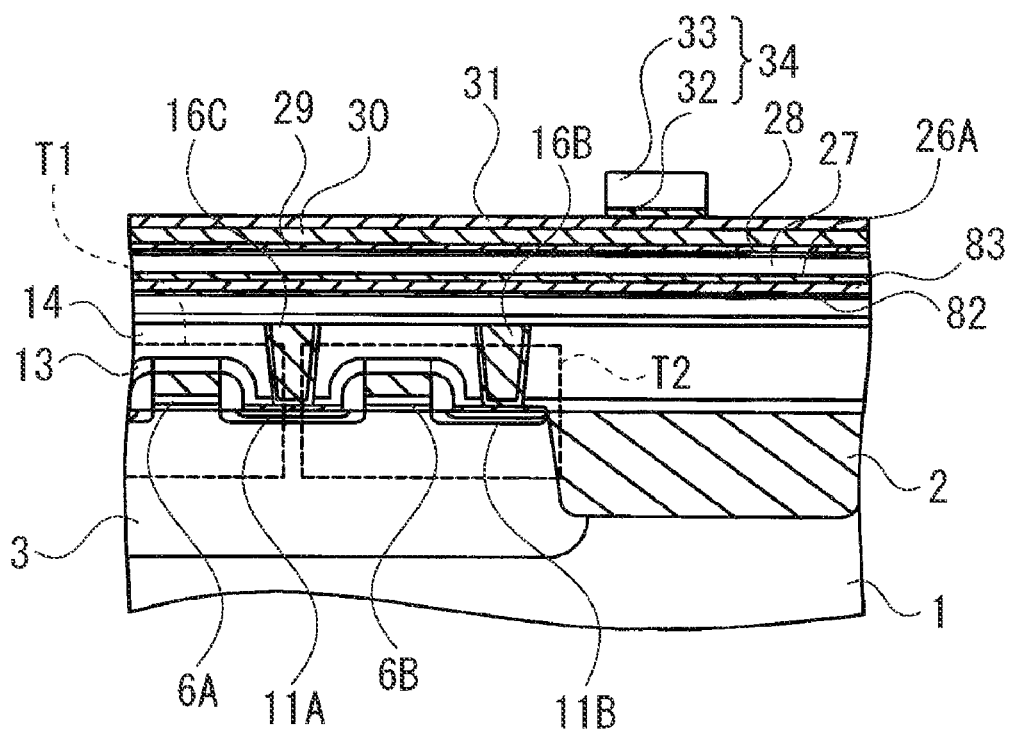

Described next is a step procedure for deriving the cross-sectional configuration of FIG. 13C.

First of all, similarly to the first embodiment, the first ferroelectric film 27 is formed with, on the entire surface thereof, the amorphous second ferroelectric film 28. The second ferroelectric film 28 is then formed thereon with, in sequence, the first upper electrode film 29, the second upper electrode film 30, the hydrogen barrier film 31, and the first and second mask material layers 32 and 33 for use each as a hard mask.

For use as the first upper electrode film 29, an iridium oxide film is formed. Then for use as the second upper electrode film 30, a precious-metal film made of Ir or others is formed. For use as the first mask material layer 32, a TiN film is formed by sputtering, and for use as the second mask material layer 33, an $SiO_2$ film is formed by CVD.

Thereafter, on the second mask material layer 33, a resist pattern (not illustrated) is formed in the shape of the upper electrode. Using the resist pattern as a mask, the first and second mask material layers 32 and 33 are then subjected to etching.

Using the first and second mask material layers 32 and 33 left below the resist pattern as a hard mask, plasma etching is performed using mixed gas containing HBr, $O_2$, Ar, and $C_4F_8$ as etching gas.

Figure 13D:
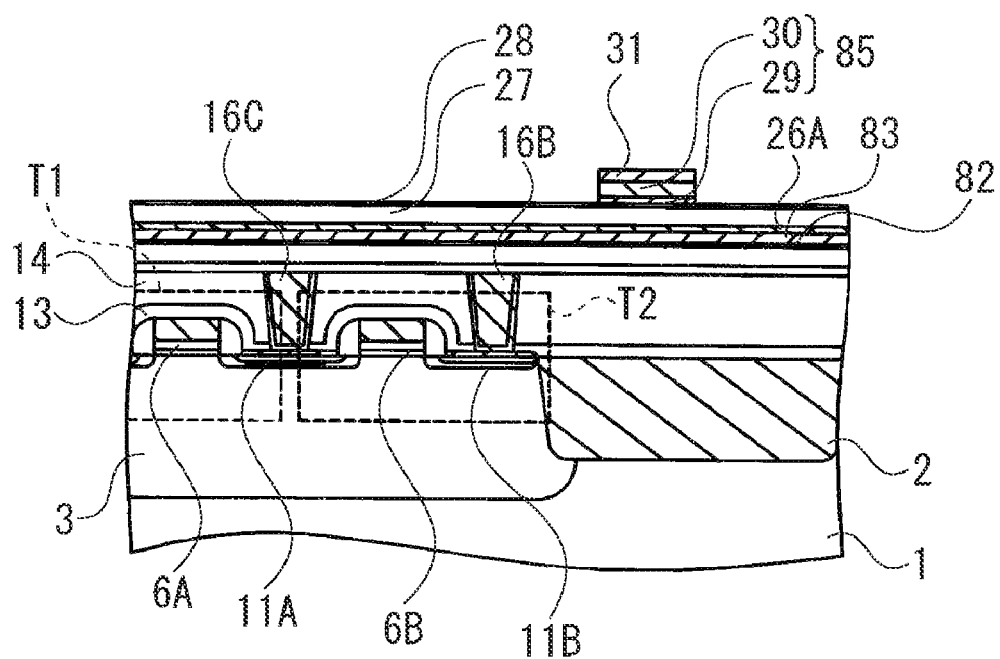

As a result, as illustrated in FIG. 13D, the upper electrode films 29 and 30 are subjected to patterning so that an upper electrode 85 is formed for use with a capacitor. After the completion of etching, the first and second mask material layers 32 and 33 are removed.

Moreover, the silicon substrate 1 after resist removal as such is subjected to a heat treatment in an atmosphere containing oxygen. The temperature for the heat treatment is between 600° C. and 700° C. In this embodiment, as an example, the heat treatment is performed at 650° C. for 40 minutes. This heat treatment is performed to recover any damage occurred to the ferroelectric films 27 and 28 during the process, and such annealing is also referred to as recovery annealing.

Figure 13E:
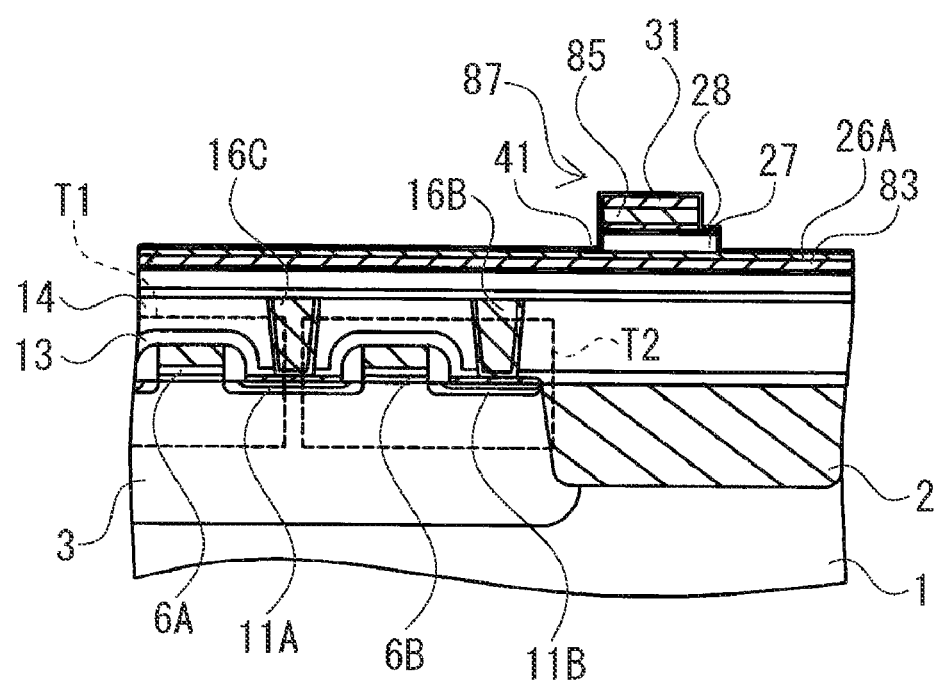

Described next is a step procedure for deriving the cross-sectional configuration of FIG. 13E.

Using the photoresist pattern after patterning as a mask (not illustrated), the ferroelectric films 27 and 28 are subjected to etching so that the films are patterned stripe. The ferroelectric films 27 and 28 are in the rectangular shape in plan view, and go below a plurality of upper electrodes 85. The resulting films are then subjected to a heat treatment in an oxygen atmosphere with a temperature of between 300° C. and 400° C. for 30 to 120 minutes, for example.

Thereafter, on such films, i.e., the hydrogen barrier film 31, the upper electrode 85, the ferroelectric films 27 and 28, and the second conductive film 26, the first protection film, i.e., $Al_2O_3$ film as the first protection film 41, is formed by sputtering or CVD, or ALD, for example.

Figure 13F:
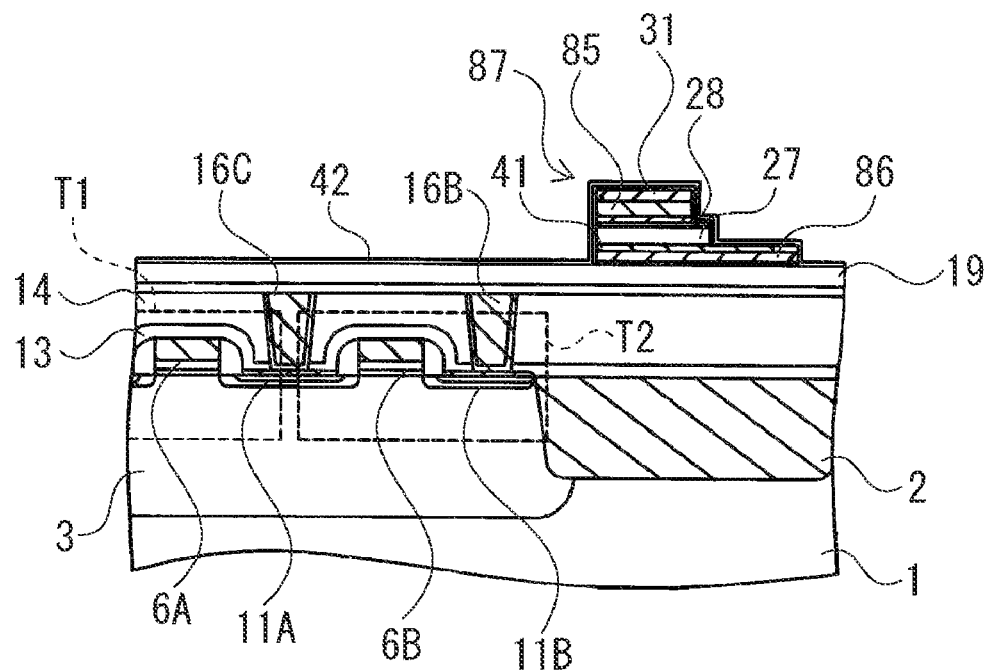

Described next is a step procedure for deriving the cross-sectional configuration of FIG. 13F.

The first protection film 30 is formed with, on the entire surface thereof, a photoresist film by spin coating, for example. The photoresist film is then subjected to patterning, by photolithography, to be in the predetermined shape in plan view, i.e., in the shape of the lower electrode of the ferroelectric capacitor in plan view.

Thereafter, using the photoresist film as a mask, the films, i.e., the first protection film 41, the second conductive film 26A, the lower electrode film 83, and the lower electrode contact film 82, are subjected to etching, thereby forming the lower electrode 86. The lower electrode 86 is in the substantially rectangular shape in plan view, and the end portion thereof lies off the edges of the ferroelectric films 27 and 28. By such films after patterning, i.e., the upper electrode 85, the ferroelectric films 27 and 28, and the lower electrode 86, a ferroelectric capacitor 87 is formed.

Moreover, the ferroelectric capacitor 87 and the second interlayer insulating film 19 are each formed thereon with the second protection film 42, i.e., $Al_2O_3$ film, by sputtering or CVD, or ALD. After the second protection film 42 is formed as such, the film is subjected to a heat treatment in an oxygen atmosphere with a temperature of between 500 and 700° C. for 30 to 120 minutes, for example. As a result, the ferroelectric films 27 and 28 are each provided with oxygen, and the electrical characteristics of the ferroelectric capacitor 87 are recovered.

Figure 13G:
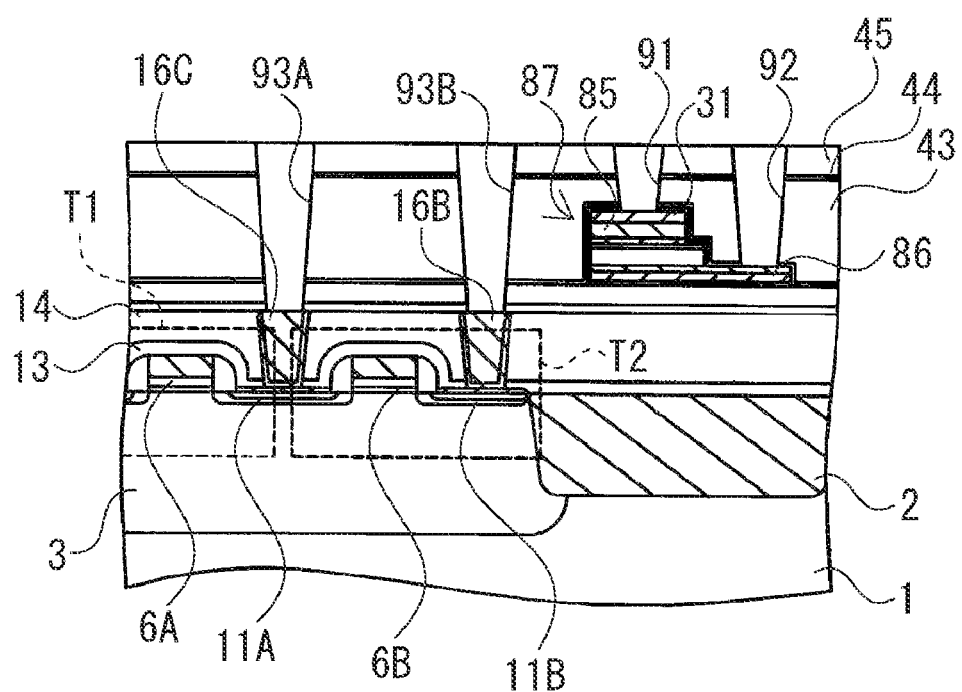

Described next is a step procedure for deriving the cross-sectional configuration of FIG. 13G.

The second protection film 42 is formed with, on the entire surface thereof, the third interlayer insulating film 43, e.g., silicon oxide, with a film thickness of 1400 nm by plasma CVD using TEOS, for example. Thereafter, by CMP, for example, the third interlayer insulating film 43 is made flat on its surface.

Then in a plasma atmosphere generated using $N_2O$ gas or $N_2$ gas, the resulting film is subjected to a heat treatment at 350° C. for 2 minutes, for example. As a result of the heat treatment as such, any moisture in the third interlayer insulating film 43 is removed, and the third interlayer insulating film 43 is changed in film quality, thereby preventing the moisture from getting into the film. With such a heat treatment, the third interlayer insulating film 43 is nitrided, thereby forming an SiON film.

Thereafter, the third interlayer insulating film 43 is formed with, on the entire surface thereof, the third protection film 44. The third protection film 44 is an $Al_2O_3$ film with a film thickness of between 20 nm and 50 nm formed by sputtering or CVD, for example. The third interlayer insulating film 43 is then formed with, on the entire surface thereof, as the fourth interlayer insulating film 45, a silicon oxide with a film thickness of 300 nm by plasma CVD using TEOS, for example.

The fourth interlayer insulating film 45 is formed with, on the upper surface, a photoresist film (not illustrated), and using the photoresist film as a mask for etching, a via hole 91 is formed with the depth of reaching the upper electrode 85 of the ferroelectric capacitor 87 via the third protection film 44, the third interlayer insulating film 43, and the second protection film 42. Similarly, etching is performed using the photoresist film formed on the fourth interlayer insulating film 45, a via hole 92 is formed with the depth of reaching the lower electrode 86 of the ferroelectric capacitor 87.

Thereafter, a heat treatment is performed in an oxygen atmosphere with a temperature of between 400 and 600° C. for 30 to 120 minutes. As a result, the ferroelectric films 27 and 28 are each provided with oxygen, and the electrical characteristics of the ferroelectric capacitor 87 are recovered. Note here that this heat treatment may be performed not in the oxygen atmosphere but in an ozone atmosphere. Also when the heat treatment is performed in the ozone atmosphere, the ferroelectric films 27 and 28 are each provided with oxygen, and the electrical characteristics of the ferroelectric capacitor 87 are recovered.

Thereafter, by photolithography and etching, via holes 93A and 93B are formed each with the depth of reaching the conductive plugs 16A to 16C after going through the third and fourth interlayer insulating films 43 and 45, the second and third protection films 42 and 44, and the second interlayer insulating film 19.

Figure 13H:
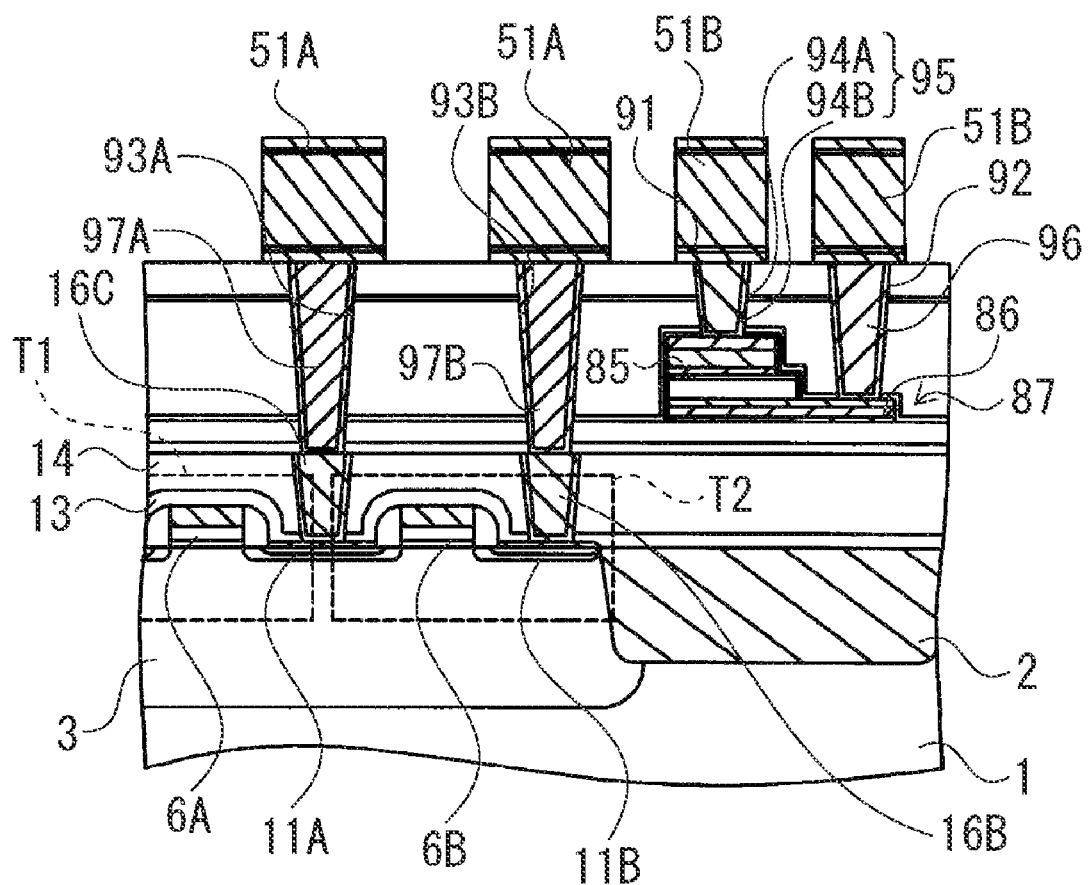

Described next is a step procedure for deriving the cross-sectional configuration of FIG. 13H.

In the via hole 91, a Ti film and a TiN film are formed in sequence by sputtering respectively with film thicknesses of 20 nm and 50 nm, for example. These Ti and TiN films form a contact film 94A to the via hole 91. Moreover, on the contact film 94A, a W film 94B is grown by CVD, and using this W film 94B, a conductive plug 95 is formed for filling the via hole 91. Similarly, a via hole 92 is formed with a conductive plug 96, and via holes 93A and 93B are formed with conductive plugs 97A and 97B, respectively.

Then on the conductive plugs 95 to 97B, a metal wiring layer on the first layer is formed. Accordingly, formed are the wiring pattern 51B electrically connected to the upper electrode 85 via the conductive plug 95, the wiring 51B electrically connected to the lower electrode 86 via the conductive plug 96, and the wiring 51A electrically connected to the source/drain areas 11A and 11B via the conductive plugs 97A and 97B.

As described above, with the manufacturing method of the semiconductor device of this embodiment, after the lower electrode film 25 is formed, the conductive oxide film 26 being an amorphous or microcrystalline metal oxide film is formed for crystallization by RTA. Then, when the initial layer of the first ferroelectric film 27 is formed, the conductive oxide film 26 is subjected to a reduction treatment with a low ratio of oxygen.

As such, after the reduction treatment to the conductive oxide film 26, the resulting second conductive film 26A will have minute crystal particles. Accordingly, when the core layer 27B of the first ferroelectric film 27 is formed by MOCVD, the morphology of the PZT film may be favorably improved. As such, with the manufacturing method for a semiconductor device including a capacitor of a planar configuration, the effects similar to those in the first embodiment may be successfully achieved.

Note here that the ferroelectric film may have the crystal configuration of a Bi-layer structure or a perovskite structure by a heat treatment, for example. Such a film includes not only a PZT film but a PZT film doped with a very small amount of La, Ca, Sr and/or Si, for example, a film made of a material having the general formula of $ABO_3$ such as SBT (bismuth strontium tantalum oxide), BLT ($(Bi, La)_4Ti_3O_{12}$), and Bi-layer structure compound, and others.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device manufacturing method, comprising
    forming a first film made of a first metal to an upper portion of a substrate;
    forming a second film made of an amorphous metal oxide or a microcrystalline metal oxide on the first film;
    subjecting the second film to a heat treatment;
    subjecting the second film to a reduction treatment after the heat treatment;
    forming a third film made of a ferroelectric material on the second film; and
    forming a fourth film made of a second metal on the third film.

2. The semiconductor device manufacturing method according to claim 1,
    wherein the heat treatment to the second film is performed in an atmospheric pressure.

3. The semiconductor device manufacturing method according to claim 1, wherein the heat treatment to the second film is rapid thermal annealing.

4. The semiconductor device manufacturing method according to claim 1,
wherein the heat treatment to the second film is performed in an atmosphere containing oxygen.

5. The semiconductor device manufacturing method according to claim 1,
wherein the second film has a thickness of between 10 nm and 40 nm.

6. The semiconductor device manufacturing method according to claim 1,
wherein the second film is formed in a temperature of between 10° C. and 100° C.

7. The semiconductor device manufacturing method according to claim 1,
wherein the second film is subjected to the reduction treatment by a solvent component included in raw material gas of the third film.

8. The semiconductor device manufacturing method according to claim 1,
wherein the metal oxide is a result of oxidation of the first metal.

9. The semiconductor device manufacturing method according to claim 1,
wherein the first metal is any of iridium, ruthenium, rhodium, and palladium.

10. The semiconductor device manufacturing method according to claim 1,
wherein an atmosphere for subjecting the second film to the heat treatment contains oxygen of 0.1% flow rate or more but 100% flow rate or less.

11. The semiconductor device manufacturing method according to claim 1,
wherein the second film is subjected to the heat treatment from 600° C. or higher to 750° C. or lower.

12. The semiconductor device manufacturing method according to claim 1,
wherein the second film is subjected to the heat treatment in a pressure equal to an atmospheric pressure or lower but equal to 1 Pa or higher.

13. The semiconductor device manufacturing method according to claim 1,
wherein after the first film is formed and before the second film is formed, the first film is subjected to the heat treatment in an inert atmosphere.

14. The semiconductor device manufacturing method according to claim 13,
wherein the first film is subjected to the heat treatment from 600° C. or higher to 750° C. or lower.

15. The semiconductor device manufacturing method according to claim 1,
wherein the second film is subjected to the reduction treatment during a period for chemical vapor deposition of an initial layer of the third film.

16. The semiconductor device manufacturing method according to claim 15,
wherein the forming of the third film of the ferroelectric material includes a process of forming, on the initial layer by CVD (Chemical-Vapor Deposition), a core layer whose film-forming rate and film thickness are higher than those of the initial layer.

17. The semiconductor device manufacturing method according to claim 15,
wherein the initial layer is formed to have a film thickness of between 2.5 nm to 10 nm.

18. The semiconductor device manufacturing method according to claim 1,
wherein the third film of the ferroelectric material is formed to have the same crystal orientation as that of the second film.

19. The semiconductor device manufacturing method according to claim 1,
wherein the third film of the ferroelectric material is formed while a ratio of oxygen gas is being changed for induction into a film-forming atmosphere.

20. The semiconductor device manufacturing method according to claim 1,
wherein the third film is made of a ferroelectric material of a perovskite or bismuth-layer structure.

* * * * *